(12) United States Patent
Benedikt et al.

(10) Patent No.: US 7,816,926 B2
(45) Date of Patent: Oct. 19, 2010

(54) HIGH FREQUENCY CIRCUIT ANALYSER

(75) Inventors: Johannes Benedikt, Cardiff (GB); Paul Juan Tasker, Cowbridge (GB)

(73) Assignee: Mesuro Limited, Cardiff (GB)

( * ) Notice: Subject to any disclaimer, the term of this patent is extended or adjusted under 35 U.S.C. 154(b) by 700 days.

(21) Appl. No.: 10/565,519

(22) PCT Filed: Jul. 23, 2004

(86) PCT No.: PCT/GB2004/003245

§ 371 (c)(1),
(2), (4) Date: Apr. 9, 2007

(87) PCT Pub. No.: WO2005/010538

PCT Pub. Date: Feb. 3, 2005

(65) Prior Publication Data

US 2007/0182424 A1    Aug. 9, 2007

(30) Foreign Application Priority Data

Jul. 24, 2003 (GB) ................................ 0317349.9

(51) Int. Cl.
*G01R 27/04* (2006.01)
*G01R 27/28* (2006.01)
(52) U.S. Cl. ...................................................... 324/637
(58) Field of Classification Search ................ 324/637, 324/76.14
See application file for complete search history.

(56) References Cited

U.S. PATENT DOCUMENTS

| 6,204,673 | B1 | 3/2001 | Andeen et al. | |
| 6,479,977 | B1 | 11/2002 | Mordkovich | |
| 6,509,743 | B1 | 1/2003 | Ferrero | |
| 7,440,576 | B2 * | 10/2008 | Jeon et al. | ...................... 381/61 |
| 2004/0207426 | A1 * | 10/2004 | Tsironis | ...................... 324/764 |

FOREIGN PATENT DOCUMENTS

| GB | 2382662 | 6/2003 |
| JP | 2002318256 | 10/2002 |

OTHER PUBLICATIONS

GB Search Report, 0317349.9.

(Continued)

*Primary Examiner*—Amy He
(74) *Attorney, Agent, or Firm*—Jackson Walker L.L.P.; Christopher J. Rourk

(57) ABSTRACT

An analyzer for measuring the response of an electronic device (DUT 206) to an RF input signal from a signal generator (240*a*) is described. An active load pull circuit (201) is connected to the DUT 206, which receives an output signal from the DUT 206 and then feeds a modified signal back to the DUT 206. The signal is modified by a signal processing circuit (237) in view of input signals x, y to control the magnitude gain and phase change effected by the feedback circuit (237). Thus, positive feedback loops are avoided and better control of the analyzer is permitted. A network analyzer, or other signal measuring device (242), logs the waveforms (from which s-parameters derived) observed at ports of the DUT 206, thereby allowing the behavior of the DUT 206 under various load conditions to be analyzed.

34 Claims, 7 Drawing Sheets

OTHER PUBLICATIONS

PCT Search Rpt, PCT/US2004/003245.

U.S. Appl. No. 10/565,519.

Ferrero et al., "Recent Technological Advances for Modular Active Harmonic Load-Pull Measurement Systems," Conference Proceedings Miller Freeman London, UK, Oct. 5, 1999, 4 pgs., (XP-002303785).

Williams et al., "A Study of the Effect of Envelope Impedance on Intermodulation Asymmetry Using a Two-tone Time Domain Measurement System," IEE MTT S INT Microwave SYMP DIG' IEEE MTT-S Int'l Microwave Symposium Digest 2002, vol. 3, 2002, 4pgs. (XP-002303884).

Print-out of part of a website by Focus Microwaves, Inc. (url http://www.focus-microwaves.com/FAQs/FAQ_Links/basics.htm).

Rotella et al., "Harmonic Balance Device Analysis of an LDMOS RF Power Amplifier with Parasitics and Matching Network," Proceedings of the 1999 Particle Accelerator Conference, New York, 1999, 8 pgs.

Corredoura, Architecture and Performance of the PEP-II Low-Level RF System, Proceedings of the 1999 Particle Accelerator Conference, New York, 1999, 5 pgs.

Agilent PN 89400-8. Using Vector Modulation Analysis in the Integration, Troubleshooting, and Design of Digital RF Communications Systems. Product note. 29 pgs.

Benedikt et al., "High-Power Time-Domain Measurement Bench for Power Amplifier Development," 2002 ARFTG Conference Digest, Washington, D.C., Dec. 5-6, 2002, 4 pgs.

Benedikt et al., "High-Power Time-Domain Measurement Bench for Power Amplifier Development," Powerpoint presentation given at 2002 ARFTG Conference, Washington, D.C., Dec. 5-6, 2002, 30 pgs.

Examination Report from corresponding Japanese Patent Application 2006-520909 with translation drafted Jan. 14, 2010 (9 pgs.).

Patent Abstracts of Japan, Publication No. 2003-060997, published Feb. 28, 2003, Applicant - Hitachi Ltd. (11 pgs.).

Patent Abstracts of Japan, Publication No. 61-256830, published Nov. 14, 1986, Applicant - Maspro Denkoh Corp. (7 pgs.).

Patent Abstracts of Japan, Publication No. 2003-341243, published Dec. 8, 2002, Applicant - Toshiba Corp. (17 pgs.).

Patent Abstracts of Japan, Publication No. 05-244025, published Sep. 21, 1993, Applicant - NEC Corp. (5 pgs.).

Patent Abstracts of Japan, Publication No. 07-198767, published Aug. 1, 1995, Applicant - ATN Microwave Inc. (30 pgs.).

* cited by examiner

HIGH FREQUENCY CIRCUIT ANALYSER

The present invention relates to analyzing the behaviour of a high frequency device, in particular, a device for use in a high power (large signal) high frequency amplifier, such as an amplifier for use in a mobile telephone network or other telecommunications-related base-station. The invention also relates to a method of improving the performance of circuits including such a device.

When analyzing the behaviour of a high frequency electronic device it is often desired to assess the behaviour of the device under the sort of conditions that the device might be subjected to during normal operation. For example, the impedance to which the device is attached during its normal/final operation may determine to a high degree the performance, for example the efficiency and/or linearity, of the device. Such considerations are for example of particular relevance when designing high frequency large signal amplifier circuits for use in for example a mobile telecommunications base station. It is therefore desirous to be able to analyses the device when subjected to a virtual load/virtual impedance at the input and/or output of the device. One means of applying such a virtual impedance is to apply an active load pull, wherein a signal with a given magnitude and phase relative to an input signal inputted into the device under test is injected into a port (for example the input or output) of the device under test.

A known load pull system is based on a feed-forward architecture, an example of which being illustrated in FIG. 1 of the accompanying drawings. FIG. 1 shows a Device Under Test (DUT) 106 connected to a load pull circuit 101 consisting of a power splitter 102, a phase shifter 103, a variable attenuator 104, and an amplifier 105. Signals $a_{SOURCE}$ received at the input side of the power splitter 102 are split into two signals, one of which $a'_{IN}$ being fed via the phase shifter 103, variable attenuator 104, and amplifier 105 to one port of the DUT 106, resulting in the signal $a_{out}$ (see the arrow $a_{out}$ pointing from right to left in FIG. 1 in accordance with standard convention), and the other $a_{IN}$ being fed directly to the other port of the DUT 106, producing the signal $b_{out}$ (see the arrow $b_{out}$ pointing from left to right in FIG. 1 in accordance with standard convention). The reflection coefficient $\Gamma_L$, which determines the impedance seen by the DUT 106 is equal to the ratio of the travelling waves $a_{OUT}$ and $b_{OUT}$, such that $\Gamma_L = a_{OUT}/b_{OUT}$. The reflection coefficient $\Gamma_L$ is set by changing the magnitude and phase of the signal $a_{OUT}$.

In the case of the feedforward load-pull circuit 101, the signal $a'_{IN}$ entering the active load pull and the signal $a_{OUT}$ leaving it are isolated when a quasi-unilateral device, for example an amplifier is used as DUT 106, keeping these two signals separated. If the input and output of the circuit are sufficiently isolated from each other then the circuit can not form a feedback loop in which a signal circles within the loop, getting amplified with each pass through the loop, leading to an uncontrolled power build-up. Thus, by ensuring that the signal $a_{OUT}$ is isolated from the signal $a'_{IN}$ a stable operation of the active load pull circuit 101 may be obtained. However, the system of FIG. 1 suffers from a disadvantage in that the setting of the reflection coefficient $\Gamma_L$ at the fundamental and the harmonic frequency is an iterative process. Since the signal $a_{OUT}$ produced by the load pull circuit is dependent on the signal $a'_{IN}$ and is independent of $b_{OUT}$, any change in the performance of the DUT 106, resulting in a different signal $b_{out}$, for example power saturation, will introduce a change in the reflection coefficients $\Gamma$ generated by the load pull circuit 101. This makes the setting of the reflection coefficient $\Gamma$ dependent on the unknown behaviour of the DUT 106, which requires continual resetting of the settings of the phase shifter 103 and variable attenuator 104 (by for example trial and error or by means of a random search) in order to keep a constant reflection coefficient at each power level. The need to adjust the settings of the phase shifter 103 and variable attenuator 104 makes the feed-forward architecture unsuitable for automation.

It has been proposed to use feedback load pull circuits, but whilst the proposed circuits might not suffer from the above-mentioned disadvantage of the feed-forward architecture, problems associated with unstable operation of such feedback load pull circuits have prevented such proposals from being of any real use. Such instabilities result from the input and output of the feedback circuit being unified, thus having effectively no isolation between them. It has been proposed to insert filters into the feedback load-pull circuit, thereby separating the input from the output of the circuit at most frequencies. However, at the operational frequency of the filter there is still no effective isolation between the input and output of the load-pull, which may result in uncontrollable power build-up, which may then lead to signal oscillations rendering any measurements of the response of the DUT of little use.

The present invention thus seeks to provide an improved analyzer and method for analyzing the behaviour of an electronic device to a high frequency input signal, and an improved method of designing and manufacturing a high frequency device.

According to a first aspect of the invention there is provided an analyzer for measuring at frequencies within a frequency range the response of an electronic device to a high frequency input signal, the analyzer including:

an active load pull circuit connectable in use to a device to be analyzed, the active load pull circuit including a feedback circuit arranged to receive an output signal from the device to be analyzed, to modify the signal and to feed the modified signal back to the device to be analyzed, wherein the feedback circuit is arranged to limit the magnitude gain of the feedback circuit at all frequencies within the frequency range.

The output signal from the device to be analyzed may be received from a port of the device (for example an input port or an output port). During use of the analyzer a high frequency signal may be applied to such a port of the device. Active load pull circuits may be used to great advantage when attempting to improve the design of a device or of a circuit in which the device is to be used. In order to enable such improvements to be made it is useful to be able to make measurements when the device is operating under conditions when the reflection coefficient is close to 1. The reflection coefficient is equal to the ratio of the output signal at a certain frequency generated by the output from the DUT (or the wave passing from the DUT) to the reflected signal at the same frequency (or to the wave passing towards the DUT). Since the signal generated at the port of the DUT is a wave, often consisting of a number of frequencies the reflection coefficient will generally be different at different frequencies. By means of the present invention it is possible to make measurements when the reflection coefficient is very close to 1, without the system becoming unstable. Without the ability to limit the magnitude gain of the feedback circuit at all frequencies within the frequency range, the analyzer (when connected to a DUT) might at certain frequencies within the frequency range form positive feedback loops (where the power gain of the circuit at that frequency might be greater than 1) potentially leading to system "lock-ups" and/or system instabilities. The function of the feedback circuit of limiting the magnitude gain may thus be considered as effectively controlling the gain of the active load pull circuit by altering (for example reducing) the bandwidth of the circuit (i.e. by limiting the magnitude gain to zero or close to zero at frequencies outside the frequency range) and/or controlling its in-band performance (at frequencies within the frequency range).

In arriving at the present invention, it was recognized that the problems relating to the instability of the active load pull feed back circuits were due to the unexpectedly great variation in gain over a relatively narrow band of frequencies. Previously, it has been proposed to use band filters (such as YIG filters) in feedback load pull circuits. The use of such filters mitigates to a limited extent the system instabilities that the present invention seeks to reduce or avoid. Such band filters typically had bandwidths of the order of 10%. Thus, frequencies across the bandwidth of the filter are able to create positive feedback loops. Over this bandwidth, the amplifier employed within the active load pull circuit may have relatively large variations in phase and magnitude, resulting in a largely varying power gain of the feed back loop over the 10% bandwidth. Thus, such a circuit is generally prone to generating positive feedback loops and consequently load pull oscillations. This problem becomes increasingly apparent when such a circuit is used to analyses the behaviour of a device when the reflection coefficient $\Gamma_L$ at a given frequency within the bandwidth of the YIG filter is close to 1 (which is often necessary for the adequate characterisation of high power devices at 10 W or greater). In such cases, because the reflection coefficient $\Gamma_L$ ($=a_{OUT}/b_{OUT}$)≈1, the load-pull generates a signal $a_{out}$ that is just less than the signal $b_{out}$ generated by the DUT at a first frequency at which the reflection coefficient is set at just below 1. Thus, the load-pull exhibits a signal gain close to 1 at the frequency of primary interest. However, the gain of the feedback load-pull circuit at other frequencies close to the first frequency will also be close to one, due to the bandwidth of the filter. It is likely that at a frequency close to the first frequency the gain of the amplifier, or change in its phase response, will be such that the reflection coefficient is larger than 1, which could resulting in oscillations at this other frequency.

Thus whilst such use of band filters may mitigate the effects of system instabilities at low reflection coefficients (for example, significantly less than 1), such a solution has limited application, because there are often system instabilities when making measurements when the reflection coefficient is close to 1. It had not before the making of the present invention been appreciated that a problem with such systems laid in the large variation in gain over a relatively small bandwidth, making a control of the load-pull gain necessary inside as well as outside the bandwidth of operation (or the bandwidth of the band filter).

Furthermore, the device itself might be such that its behaviour oscillates at the first frequency, even though the reflection coefficient is less than 1, thus leading to power build-ups and potentially to damage to (and possibly destruction of) the device and/or the analyzer. Such power build-ups at a frequency exactly equal to the first frequency cannot be avoided by the provision of a filter, because such a filter would have to allow signals at the first frequency to pass (in order for the signals from the device at the frequency of interest—at the first frequency—to be generated and monitored). However, by limiting the in-band magnitude gain, for example by introducing a control of the magnitude and/or phase of the feedback circuit gain, the aforementioned problem can be avoided.

The present invention may also be of advantage in that it enables the provision of an analyzer including an active load pull circuit, where components of the active load pull circuit need not have constant gain, even over a relatively narrow bandwidth, because the gain within the frequency range of interest is effectively controlled. Thus the components used in the active load pull circuit do not need to have ideal or close to ideal characteristics for the analyzer to perform adequately. Indeed the components used may be substantially cheaper in cost that might otherwise be required and thus costs may be reduced without greatly affecting overall performance.

Thus the invention provides an analyzer by which the analysis of high frequency high power electronic devices may be made more reliable and/or may be effected in a more cost-effective manner than hitherto possible.

The active load pull circuit may consist of the feedback circuit and no other components. However, the active load pull circuit may alternatively include other components that do not contribute significantly to the feedback effect of the feedback circuit.

The analyzer may be so arranged that the magnitude gain of the feedback circuit at one or more frequencies within the frequency range is able to be adjusted.

The analyzer may be so arranged that the phase change effected by the feedback circuit at one or more frequencies within the frequency range is able to be adjusted.

The feedback circuit may be arranged to restrict the phase change effected by the feedback circuit at all frequencies within the frequency range. For example, the feedback circuit may be arranged to restrict the phase change effected by the feedback circuit to minimise the risk of positive feedback in the feedback circuit and/or circuit oscillations. For example, phase changes that bring about such undesirable results generally relate to integer multiples of 180 degrees, for example 0 degrees or 360 degrees.

According to a related aspect of the invention there is provided an analyzer for measuring at frequencies within a frequency range the response of an electronic device to a high frequency input signal, the analyzer including: an active load pull circuit connectable in use to a device to be analyzed, the active load pull circuit including a feedback circuit arranged (i) to receive an output signal from the device to be analyzed, (ii) to modify the signal and (iii) to feed the modified signal back to the device to be analyzed, wherein the feedback circuit is arranged to control the magnitude and/or phase of the gain of the feedback circuit at all frequencies within the frequency range. It will be appreciated that any of the features described herein in relation to other aspects of the invention may be incorporated into this aspect of the invention.

The ability to control the magnitude and phase of the feedback at frequencies in a certain bandwidth (the frequency range) by means of the analyzer (and active load pull circuit) is a particularly advantageous feature of the present invention. The feature enables an active load pull circuit to be utilised in relation to signals at frequencies and powers equal to those used in a real telecommunications system, where signals usually consist of closely spaced frequencies, which could not be separated by filters (such as the YIG filters within the active load pull circuits proposed in the prior art).

The analyzer is advantageously able to set a value of the impedance at each of a plurality of frequencies and/or bandwidths. This may be achieved by means of the feedback circuit being able in use to apply a preset load to the device to be analyzed. The analyzer may be arranged to be able to control the impedance at each of a plurality of frequencies/bandwidths. There may during use for example be a plurality of load-pull circuits attached to the device. The analyzer may be able to make measurements at frequencies outside the frequency range. The analyzer is preferably able to measure over a plurality of discrete ranges of frequencies the response of an electronic device to a high frequency input signal. The active load pull circuit, or the analyzer, may include a separate feedback circuit associated with each of the plurality of discrete ranges of frequencies. The or each feedback circuit is preferably arranged to limit the magnitude gain of the feedback circuit at all frequencies within the frequency range with which the feedback circuit is associated. The frequency range, or at least one of the discrete ranges of frequencies, may cover the frequency of the input signal. The frequency range, or at least one of the discrete ranges of frequencies, may for example be substantially centred on the frequency of the input signal applied in use to the device to be analyzed. The discrete ranges of frequencies may each cover a frequency that is a cardinal multiple of the input signal. The discrete ranges of frequencies may each be substantially centred on a frequency that is a cardinal multiple of the input signal. It will be understood that the frequencies corresponding to the cardinal multiples of the input signal will include harmonics of the fundamental frequency of the input signal.

When the analyzer is arranged to measure over a plurality of discrete ranges of frequencies, it may be considered that the frequency range includes a plurality of discrete bands of frequencies. Such discrete bands may be considered as sub-ranges of the frequency range.

The feedback circuit may also be arranged to modify signals outside the frequency range. For example, the feedback circuit may be arranged to limit the magnitude gain of the feedback circuit at certain frequencies outside the frequency range. Also, the feedback circuit may be arranged to restrict the phase changes effected by the feedback circuit at certain frequencies outside the frequency range. Such modifications outside of the frequency range need not necessarily be controllable.

The feedback circuit may be so arranged that it acts as a band filter having a bandwidth covering frequencies within the range. The feedback circuit may be so arranged that it acts as a band filter having a bandwidth of greater than 10 MHz. The feedback circuit may, for example, include a high pass filter. The feedback circuit may, for example, include a low pass filter. The feedback circuit may, for example, include a band filter. Where there are more than one feedback circuits each feedback circuit may include any the features described herein with reference to "the feedback circuit".

The analyzer may include a high frequency band filter circuit arranged to filter signals in or from the feedback circuit before they are fed back to the device, the band filter circuit having a bandwidth covering frequencies within the range. The feedback circuit may act as or comprise a narrow band filter circuit. Said narrow band filter circuit may for example simply be in the form of a narrow band filter, for example forming a part of the feedback circuit. The gain of the feedback circuit may be such that between first and second frequencies differing by 1% there is a variation in the gain of the feedback circuit of greater than 5%. Said narrow band filter circuit may have a bandwidth of less than 0.1% of the frequency on which the bandwidth is centred. The cut-off frequencies of the bandwidth may both be between the first and second frequencies mentioned immediately above. Said narrow band filter circuit may have a bandwidth such that the maximum variation in the gain of the circuit including the feedback circuit and said narrow band filter circuit in respect of frequencies within the bandwidth of said narrow band filter circuit is less than 20%.

The signal(s) applied to the device, in use, preferably include a signal having a fundamental frequency greater than 500 MHz. The analyzer is advantageously suitable for analyzing high frequency devices when subjected to high frequency signals, for example signals having a fundamental frequency between 500 MHz and 50 GHz or more. Of course, the analyzer may also be able to operate in respect of signals having frequencies outside this range.

The analyzer is advantageously suitable for analyzing high power devices when subjected to high power signals, for example signals exceeding 1 Watt and is especially advantageous at power levels exceeding 10 Watts. The device may be a high power transistor. The device may for example be a device suitable for use in a high power amplifying circuit in a telecommunications base station.

As mentioned above, the feedback circuit may act as a band filter for example having a bandwidth of greater than 10 MHz (for example by means of the feedback circuit comprising an appropriate filter such as a band filter). The feedback circuit need not comprise a band filter. In such cases (where the feedback circuit performs a filtering function, but does not include a conventional band filter), it will be understood that the circuit may be considered as comprising a narrow band filter circuit. The feedback circuit may be so arranged that it acts as a band filter having a bandwidth of greater than 20 MHz. Increasing the effective bandwidth may increase the amount of information that can be ascertained regarding a device to be analyzed by the analyzer. Having a narrow band filter, say having a bandwidth less than 10 Mz (at frequencies of the order of GHz), may reduce problems associated with positive feedback and circuit oscillations, but this is at the expense of the information that can be ascertained regarding the device to be analyzed with the analyzer. The filtering may, if over too narrow a bandwidth, cut out frequencies of interest. Despite these disadvantages, there may in certain circumstances (for example in cases where it is desired to reduce noise in the measurements) be advantage in having a very narrow bandwidth. The bandwidth of said narrow band filter circuit is preferably adjustable to bandwidths of less than 1 MHz. For example, if the frequency on which the bandwidth is centred is 1.8 GHz, the bandwidth may be of the order of 500 kHz and may even be of the order of 200 KHz. Having such a narrow band filter may be of use in cases where the gain of the feedback circuit varies greatly with frequency. For example, the gain of the feedback circuit may vary by 10% over a 15 MHz bandwidth. The gain is therefore not constant over the relatively narrow bandwidth, but is well within acceptable limits. The analyzer may be so arranged that the maximum variation of the gain of the feedback circuit, during normal operating conditions, is less than 1% and more preferably less than 0.1%. The bandwidth of the narrow band filter circuit may for example be less than 0.05% of the frequency on which the bandwidth is centred and may for example be of the order of 0.01% of the frequency on which the bandwidth is centred. The bandwidth of the band filter circuit is preferably variable, for example, between 0.05% and 10% of the frequency on which the bandwidth is centred.

Advantageously, the frequency response of the feedback circuit is able to be controlled and preferably able to be preselected. The narrow band filter circuit mentioned above could form any part of the active load pull circuit, and does not necessarily form a part of the feedback circuit. The signal from the device to be analyzed may for example, pass through the narrow band filter circuit before or after being modified by the feedback circuit.

The feedback circuit may include a heterodyne filter ring circuit. The heterodyne filter ring circuit preferably includes a first mixer, a second mixer, and a signal-modifying unit, preferably with variable bandwidth.

The heterodyne filter ring circuit is advantageously so arranged that in use it receives an input at the first mixer together with a signal having a preselected frequency, and the output from the first mixer is sent via the signal-modifying unit to the second mixer, where it is combined with a signal having a frequency equal to the preselected frequency to produce the output signal of the heterodyne filter ring circuit. The signal-modifying unit may be arranged to receive an input signal from the first mixer and to send an output signal to the second mixer. The signal-modifying unit may comprise a signal processor.

The signal-modifying unit could include a digital signal processor that is arranged to receive an analogue input signal from the first mixer via an analogue-to-digital converter and to send an output signal to the second mixer via a digital-to-analogue converter.

Preferably, the signals having a preselected frequency received by the first and second mixers are produced by a single signal generator. The signal having a preselected frequency is advantageously produced by a variable signal oscillator. The signal-modifying unit may be in the form of, or act as, a band-pass filter, preferably with a variable bandwidth. The heterodyne filter ring circuit may thus be able effectively to down-convert an input signal to a lower frequency, to filter the signal at that lower frequency and to up-convert the filtered signal to a higher frequency, the bandwidth of the heterodyne ring filter circuit being substantially equal to the bandwidth of the filtering at the lower frequency. It will be appreciated that the mixer(s) may be in the form of any suitable component that, when fed with two signals at different frequencies, outputs a signal including a component at a frequency equal to the difference between the frequencies of the input signals (preferably without any substantial non-linear behaviour at the output frequency under normal operating conditions).

The feedback circuit preferably includes a signal processor able in use to modify the signal from the device to be analyzed by a preselectable amount. The signal processor may be in the form of, or form a part of, a signal-modifying unit. For example, the signal processor may be in the form of a signal-modifying unit of the heterodyne filter circuit mentioned above. The signal-modifying unit may be an analogue signal-modifying unit. The signal-modifying unit may be a digital signal-modifying unit. In the case, where the signal-modifying unit (or signal processor) is arranged to receive and/or to output a digital signal, there is advantageously provided a converter (either or both an analogue-to-digital converter and a digital-to-analogue converter, as appropriate).

Preferably, the signal processor is adjustable, so that the modification of the signal from the device is able to be altered. The signal processor is advantageously programmable, for example so that the modification of the signal from the device is able to be pre-programmed.

The signal processor may be in the form of a variable amplitude modifying circuit. The signal processor may be in the form of a variable phase modifying circuit able in use to modify the phase of a signal from the device to be analyzed by a preselectable amount. Preferably, the signal processor is able to modify both the phase and magnitude of signals.

In an embodiment described below of the invention, the signal-modifying unit includes a digital signal processor that is arranged to receive an analogue input signal from the first mixer via an analogue-to-digital converter and to send an output signal to the second mixer via a digital to analogue converter. In such a case it is preferred that the digital signal processor is in the form of a computer or is operated under the control of a computer. In that embodiment the analyzer includes a narrow band filter, and the analogue-to-digital converter is an 8 bit sampler and samples the incoming analogue signal at a rate of at least four times the frequency on which the bandwidth of the narrow band filter is centred. The digital signal processor, and possibly the analogue-to-digital converter and/or the digital to analogue converter, is/are advantageously so arranged that, in use, the analogue signal outputted by the digital to analogue converter is filtered to exclude components of the signal received at the analogue-to-digital converter outside a given bandwidth, thereby performing the function of a band filter.

The signal processor, especially when in the form of a digital signal processor, may be arranged to compensate for non-ideal behaviour of components of the analyzer and, in particular, of the active load pull circuit. For example, when a heterodyne filter ring circuit is provided, the (optionally digital) signal processor may be arranged to compensate for non-linear behaviour of the mixers. Such a use of the digital signal processor may provide a less expensive solution to problems associated with mixers, or other components, having unacceptable non-linear behaviour, rather than simply replacing the components with better quality, and more expensive components. The (optionally digital) signal processor may also be arranged to compensate for problems associated with signal leakages, for example of the signal generator(s) used to provide the signals having a preselected frequency. Signal leakages could alternatively or additionally be reduced by providing a further filter arranged to block such signal leakage.

The signal processor is advantageously arranged to provide both in-band and out-of-band signal modification. For example, the signal processor may be arranged to filter out signals outside a given band of frequencies and to control the magnitude and/or phase of signals within said band so as to reduce the likelihood of positive feedback (with the aim of avoiding signal oscillations within the load-pull circuit).

The feedback circuit advantageously includes a variable amplitude modifying circuit able in use to modify the amplitude of a signal from the device to be analyzed by a preselectable amount. The variable amplitude modifying circuit may for example include a variable amplifier. The variable amplitude modifying circuit may include a variable amplifier and a fixed amplifier. The amplitude modifying circuit may be able in use to modify the amplitude of a signal from the device to be analyzed by an amount dependent on the frequency of the signal, or components thereof.

The feedback circuit advantageously includes a variable phase modifying circuit able in use to modify the phase of a signal from the device to be analyzed by a preselectable amount. A signal modulator may, for example, form at least a part of the phase modifying circuit. The variable phase modifying circuit may be able in use to modify the phase of a signal from the device to be analyzed by an amount dependent on the frequency of the signal, or components thereof.

The (optionally digital) signal processor (for example of the heterodyne ring filter circuit) described above may form at least a part of a variable amplitude modifying circuit and/or form at least a part of a variable phase modifying circuit. Advantageously, the (optionally digital) signal processor is able, in use to act as a filter circuit, an amplitude modifying circuit and a phase modifying circuit. The function of the amplitude and phase modifying circuits may be provided by the digital signal processor by means of it processing the IQ values of the signal.

The signal processor may be arranged to process respective signals representative of the I and Q values of a signal. The feedback circuit may include an IQ modulator and an IQ demodulator. For example, the signal processor mentioned above may receive signals from an IQ demodulator and send signals to an IQ modulator. The signal processor could, for example, by processing the IQ signals perform the function of both an amplitude and a phase modifying circuit. The IQ modulator and/or demodulator may be arranged to be under the control of a computer. The IQ demodulator may be arranged to receive an input signal having at a given frequency an amplitude and a phase and to produce two output signals, one relating to the I-value and the other relating to the Q-value, the I and Q values being representative of the point on a rectangular plot corresponding to the amplitude and phase. The IQ modulator may be arranged to receive two input signals, one relating to an I-value and the other relating to a Q-value, the I and Q values being representative of the point on a rectangular plot corresponding to an amplitude and a phase and to produce an output signal at the given frequency, having the amplitude and phase corresponding to the I and Q values. The IQ modulator and demodulator may modulate and demodulate signals having a plurality of frequency components. The IQ modulator and IQ demodulator may each comprise one or more signal mixers.

The feedback circuit may comprise a component, comprising for example a mixer or an IQ demodulator, that converts a high frequency input signal into a signal that is able to be processed by the signal processor. In such a case, the feedback circuit may comprise a component, comprising for example a mixer or an IQ modulator, that converts the signal processed by the signal processor back into a high frequency output signal.

The feedback circuit may for example be arranged to downconvert high frequency input signals to a lower frequency, modify the signals, and then upconvert the modified signals to high frequency output signals. Thus, the feedback circuit may operate at frequencies significantly different from the frequency of the signal(s) fed back to the device to be analyzed. The active load pull circuit may therefore, in use, produce an output signal at a frequency significantly different from the frequency at which the feedback circuit is controlled. Oscillations between the device to be analyzed and the active load pull circuit can be significantly reduced, or eliminated, if there are no frequencies at which the device to be analyzed and the active load-pull circuit can influence each other, such as frequencies the same as or similar to the frequency of the signal which is fed back to the device to be analyzed by the active load-pull circuit, (typically, a high frequency signal, for example of the order of 1.8 GHz). However, any internal oscillations in the active load pull circuit are likely only to occur at the downconverted frequencies at which the signals are modified (typically, a relatively low frequency signal, for example of the order of 20 kHz). Consequently, any variations of the impedance of the device to be analyzed can be observed only at 1.8 GHz, which are highly unlikely to give rise to any oscillations at 20 kHz. As a result, the separation of the frequency at which the active load pull produces the feedback signal from the frequency at which the signal is modified provides stability and greatly reduces the risk of internal circuit oscillations and positive feedback at all frequencies of interest. Such an advantage may have independent application and as such the present invention further provides an analyzer for measuring at frequencies within a frequency range the response of an electronic device to a high frequency input signal, the analyzer including a load pull circuit connectable in use to a device to be analyzed, the load pull circuit including a signal modifying circuit arranged (i) to receive a signal to be modified, (ii) to downconvert the signal received to a low frequency signal, to modify the low frequency signal, to upconvert the modified low frequency signal to a modified high frequency signal and (iii) to feed the modified signal to the device to be analyzed. Such an arrangement may reduce the risk of undesirable positive feedback or signal oscillations. This aspect of the present invention may of course include features of other aspects of the invention described herein. For example, the load pull circuit may be in the form of a feedback circuit, so that the signal received by the signal modifying circuit is one that is outputted from the device to be analyzed. The downconversion of signals may result in the signal being converted into I and Q signals as described above.

The analyzer preferably includes a signal generator arranged to send an input signal to the device to be analyzed. The signal generator is preferably able to produce high frequency signals of, for example, at least 1 GHz. The signal generator is preferably able to produce high frequency signals of, for example, up to 50 GHz. The frequency of the or each component of the signal produced by the signal generator is advantageously able to be preselected.

The analyzer preferably includes a signal-measuring device for measuring loads arising in response to the signals applied to the device to be analyzed. The signal-measuring device may, for example, be in the form of a vector network analyzer or a microwave transition analyzer.

The analyzer advantageously includes a computer for controlling and/or automating processes. The computer is preferably programmed to be able in use to set substantially all of the parameters able to be preselected by the electronic components of the analyzer. Preferably a single computer is provided to perform the running of the analyzer and the logging of data resulting from measurements made during the running of the analyzer.

Above, reference is made to a heterodyne filter ring circuit including first and second mixers, and a digital signal processor that may act as a band filter circuit. Such a filter ring circuit may have applications other than in relation to performing the function of modifying signals in accordance with the present invention. The present invention thus provides a filter circuit comprising a first mixer and a signal-modifying unit, wherein the filter circuit is so arranged that, in use, the circuit receives a first input signal at the first mixer together with a second signal produced by a part of the filter circuit, the first mixer combines the first and second signals to produce a third signal having a component at a difference frequency, the difference frequency being equal to the difference between the frequencies of the first and second signals, and the third signal is modified by the signal-modifying unit substantially to remove any components of the third signal at frequencies outside a band of frequencies that includes the difference frequency. Advantageously, the resulting modified signal outputted by the signal-modifying unit is then received at a second mixer, where it is combined with a fourth signal produced by a part of the filter circuit to produce a filtered output signal retaining characteristics of the input signal. Advantageously, the filter circuit is arranged to receive and output high frequency signals, in which case the first, second and fourth signals may be high frequency signals. Preferably the frequency of the second signal is substantially equal to the frequency of the fourth signal.

Preferably, the magnitude difference between the second signal and the fourth signal is substantially constant, and may for example be zero (or at least negligible). Preferably, the phase of the second signal is substantially equal to the phase of the fourth signal. The second and fourth signals are conveniently produced by the same part of the filter circuit, which may for example be in the form of a variable signal generator. The third signal advantageously retains information from which the phase and magnitude of the first signal can be ascertained. The characteristics retained in the output signal of the circuit may for example relate to the phase and/or the magnitude of the input signal. Advantageously, the circuit may be used to receive a signal having a component at a given frequency, having a given phase and magnitude, and to output a signal substantially consisting of that component and having the same phase and magnitude. Advantageously, the filter circuit may be used as a very narrow band high frequency filter circuit where the pass-band has a width less than 0.1% (and more preferably less than 0.05%) of the frequency on which the band is centred, which frequency is preferably greater than 500 MHz. Advantageously, the filter bandwidth may be variable to adjust to the receiving first signal.

The present invention also provides an active load pull circuit suitable for use as the active load pull circuit of the analyzer of the present invention as described herein. The active load pull circuit may for example include a feedback circuit arranged to receive an output signal from the device to be analyzed, to modify the signal and to feed the modified signal back to the device to be analyzed, wherein the feedback circuit is arranged to limit the magnitude gain of the feedback circuit at all frequencies within the frequency range. The active load pull circuit may also include any of the features of the active load pull circuit of the analyzer of the present invention as described herein.

The present invention also provides a method of measuring the response of an electronic device to a high frequency input signal, the method including the steps of:

providing an electronic device to be analyzed, applying a high frequency signal to the device, and modifying an output signal from the device and then feeding the modified signal back to the device, thereby forming a feedback loop, and measuring, at a plurality of frequencies within a frequency range, the response of the device to the signal applied to the device, wherein the magnitude gain of the feedback loop is limited at frequencies within the frequency range.

The method may include a step of preselecting the way in which the output signal from the device is modified. For example, the method may include a step of programming a control unit, microprocessor or the like. The modification of the output signal from the device may be performed such that the signal is modified in a different way at different frequencies. The modification of the output signal may involve modifying the phase and/or the magnitude of the signal. The phase change effected by the feedback loop may be restricted at certain frequencies within the frequency range. The method may include a step of preselecting the magnitude of gain applied to the output signal from the device. The method may include a step of preselecting a phase change applied to the output signal from the device.

The measuring of the response of the device to the signal applied to the device may be performed at a multiplicity of frequencies across a single range of frequencies. The measuring of the response of the device to the signal applied to the device may be performed at a plurality of different frequencies across a plurality of ranges of frequencies. The measuring of the response of the device to the signal applied to the device may be performed in respect of a plurality of frequencies within any of a plurality of discrete frequency ranges. The ranges of frequencies may each correspond to fundamental frequency of the signal applied to the device and its harmonics. The or each discrete frequency range may be centred on a frequency that is a cardinal multiple of the frequency of the fundamental frequency of the signal applied to the device. The load pull method may, if the number is 2 or more, thus be in the form of a harmonic load pull method. The magnitude gain of the feedback loop may be limited at frequencies within a plurality of discrete frequency ranges.

The step of modifying the output signal from the device may include filtering out signals having frequencies outside a band of frequencies covering frequencies within the frequency range. The step of modifying the output signal from the device may include filtering out all signals having frequencies within a plurality of discrete sub-ranges of frequencies. The sub-ranges of frequencies may cover frequencies between the upper and lower frequencies defining the frequency range.

The method is advantageously able to be performed such that the gain of the feedback loop at frequencies within the frequency range is limited to be less than 1. The method may be performed in such a way that the gain within the frequency range varies from below 0.5 to above 0.8. The method may be performed in such a way that the gain at the frequencies of interest is between 0.5 and 1, possibly between 0.8 and 1.

The fundamental frequency of the signal applied to the device is preferably over 1 GHz. The fundamental frequency may between 500 MHz and 50 GHz.

The method is advantageously repeated and performed in respect of a multiplicity of different modifications of the output signal from the device. The method may for example be repeated and performed in respect of a multiplicity of different input signals applied to the device. The different input signals applied to the device may be at different frequencies and/or under different load conditions. The method may for example be performed to simulate different loads on the device. The method may be performed to simulate different impedances applied to the device. A load or impedance may be simulated by means of the difference between the signal applied to the device and the corresponding signal response from the device. Of course, at least one port of the device will be subjected to an active load pull.

The modifications made to the signal on each separate performance of the method may effectively consist of a systematic trace of signals through the IQ plane. The modifications made may include a multiplicity of different modifications of the I value at each of a multiplicity of different modifications of the Q value. For example, the modifications made may include at least ten different modifications of the I value at each of at least ten different modifications of the Q value.

The input signal is preferably a high power input signal of, for example, at least 1 Watt and more preferably greater than 10 Watts. The method is advantageously repeated and performed in respect of a multiplicity of different input signals applied to the device. The different input signals may for example be a multiplicity of separate input signals at different powers. The input signals may for example be a multiplicity of separate input signals at different frequencies. For each input signal, the method is preferably repeated and performed in respect of a multiplicity of different modifications of the output signal from the device being analyzed. For example, for each input signal, the multiplicity of different modifications made to the signal fed back to the device may effectively consist of a systematic trace of signals through the IQ plane (for example, as described above).

The step of modifying the output signal may be performed by a circuit including a heterodyne filter ring circuit. The heterodyne filter ring circuit may be in the form of the heterodyne filter ring circuit according to any of the aspects of the analyzer of the present invention as described herein. For example, the heterodyne filter ring circuit may include a first mixer, a second mixer, and a signal-modifying unit. The method may be such that the first mixer receives an input signal at a first frequency together with a signal having a second frequency, the second frequency being preselected to be close to the first frequency, the output from the first mixer being sent to the signal-modifying unit, the signal-modifying unit extracting a signal having a frequency equal to the difference in the frequency of the first and second frequencies, and outputting a signal derived from the extracted signal to the second mixer, where it is combined with a signal having a frequency equal to the second frequency to produce the output signal of the heterodyne filter ring circuit. The signal-modifying unit may be in the form of the signal-modifying unit according to any of the aspects of the analyzer of the present invention as described herein. It is especially preferred, for example, that the signal-modifying unit includes a signal processor that advantageously processes signals representative of IQ values or the like. The second frequency may be preselected to be substantially equal to the first frequency, so that the signal extracted by the signal-modifying unit is a DC signal. In such a case, the method may be so performed that information regarding the magnitude of the signal received at the first mixer can be ascertained from the magnitude of the DC signal and the phase of the signal received at the first mixer relative to the phase of the output signal from the second mixer can be controlled by changing the relative phase of the signal having the fourth frequency with respect to the phase of the signal applied to the device. Other features of the heterodyne ring circuit described herein with reference to the analyzer of the present invention may, where appropriate, be incorporated into the aspects of the method of the invention as described above. For example, the signal-modifying unit of the filter circuit may be in the form of a band-pass filter and/or may include a signal processor, for example a digital signal processor.

A signal processor is advantageously used in the method, for example, in the step of modifying the output signal from the device. The signal processor may perform a band filtering function. The signal processor may perform one or more of the following steps: modifying the frequency of the signal, modifying the magnitude of the signal, modifying the phase of the signal, modifying the I-value of the signal and the Q-value of the signal. The signal processor may also compensate for non-ideal behaviour of one or more other components used in the method.

The present invention also provides according to a related aspect of the invention (which may be incorporated into the step of modifying an output signal as described above) a method of filtering and/or modifying an input signal having a first frequency, which is preferably greater than 500 MHz, the method including the steps of combining the input signal with a signal at a second frequency to produce a third signal having a component at a difference frequency, the difference frequency being equal to the difference between the first and second frequencies, and modifying the third signal substantially to remove any components of the third signal at frequencies outside a band of frequencies that includes the difference frequency, wherein the band has a width, which can be less than 0.1% (and preferably less than 0.05%) of the first frequency. Preferably the method also includes a step of combining the third signal as modified with a signal having a fourth frequency, the fourth frequency preferably being substantially equal to the second frequency. Such a method may be incorporated into any aspect of the method of the present invention.

The method preferably includes one or more calibration steps. One such calibration step may be performed to calibrate the loads generated by the feedback loop in relation to the amount of modification made to the signal fed back to the output of the device. During such a calibration step the load generated by the feedback loop, in relation to a given modification made to the signal fed back to the output of the device, is advantageously measured and recorded. A multiplicity of different modifications are advantageously made during the calibration, measurements of the loads generated being recorded in respect of each such signal modification. During subsequent performance of the method, it is then advantageously possible, during the step of modifying the signal, for an appropriate modification to be made in order to produce a predetermined load at the output of the device. A user or a controlling computer may thus be able to select a desired load (to be applied by the active load pull), which is then applied by means of the automatic selection of the appropriate signal modification in view of the calibration data. For example, the method may be such that the calibration data relates to loads produced by a multiplicity of signal modifications representable by a matrix of points in the IQ plane, a computer is instructed to apply a desired load by means of the active load pull, and the computer ascertains the I and Q values that would produce the desired load (by interpolation or extrapolation if necessary).

The invention also provides a calibration method comprising repeating the following steps for a multiplicity of different loads:

applying a high frequency signal at the input of the feedback loop or feedback circuit, and modifying the applied high frequency signal and feeding the modified signal back to the input to synthesise a load, measuring, at a plurality of frequencies within a frequency range, the modified signal at the input, calculating the load represented by the feedback loop or feedback circuit in response to the particular modification made to the applied signal, and storing electronically the results of the measurements against the modifications to the signal. The calibration method may be performed so that predetermined loads are applied at the output of the device by selecting an appropriate modification during the step of modifying the signal in accordance with the electronically stored measurements.

The method is advantageously performed at least partly under the control of a computer.

The method may be performed with an analyzer according to the present invention as described herein. The analyzer or active load pull circuit of the present invention as described herein is preferably so arranged as to be able to perform any or all aspects of the method of the present invention as described herein.

The present invention further provides a method of improving the design of a high frequency high power device or a circuit including a high frequency high power device, the method including the steps of analyzing the behaviour of the device either by using the analyzer according to the present invention or by performing the method according to the present invention, and then modifying the design of the device or modifying the circuit including the device in consideration of the results of the analyzing of the behaviour of the device. The present invention yet further provides a method of manufacturing a high frequency high power device or a circuit including a high frequency high power device, the method including the steps of improving the design of a similar existing device or of an existing circuit including such a device by performing the method described immediately above and then manufacturing the device or the circuit including the device in accordance with the improved design.

Reference is made herein to limiting the magnitude gain of the feedback circuit at all frequencies within the frequency range. It will be appreciated that the limiting of the gain need only be actively applied at frequencies at which the gain is likely to give rise to positive feedback or oscillations. Thus, where a signal processor or other component or device is used actively to limit the magnitude gain, such a component or device need only actively limit the magnitude gain at certain frequencies within the frequency range, the limiting of the magnitude gain of the feedback circuit at other frequencies within the frequency range being provided as a natural consequence of the arrangement of the feedback circuit in relation to the other devices (such as the DUT, for example) and/or components to which it is attached.

It will be understood that any features of the above-described aspects of the invention may be incorporated into other aspects of the present invention. For example, features described with reference to the analyzer of the invention may be incorporated with suitable changes into aspects of the method of the present invention.

Embodiments of the invention will now be described, by way of example only, with reference to the accompanying schematic drawings of which, FIG. 1 shows a circuit diagram of a prior art active load pull circuit;

FIG. 3 shows a narrow band filter suitable for use in the circuit shown schematically in FIG. 2a;

FIG. 4 shows a modulator suitable for use in the circuit shown schematically in FIG. 2a;

Figure 1:
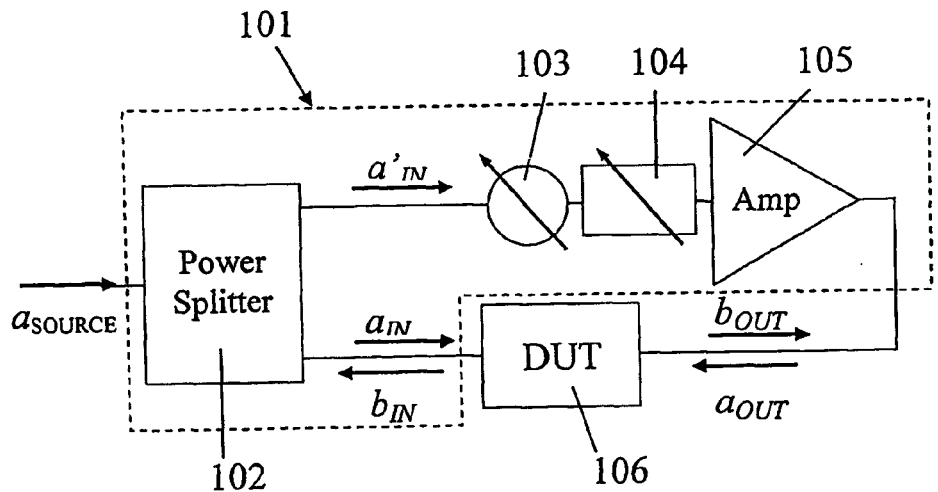
Figure 2A:
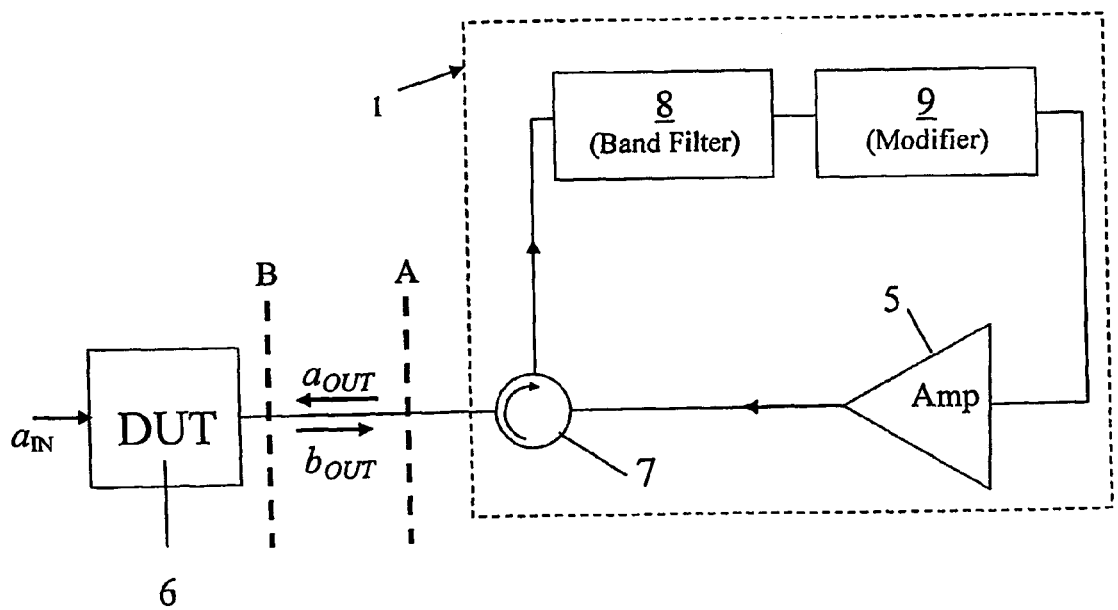
FIG. 2a shows a schematic circuit diagram of an active load pull circuit according to a first embodiment.

FIG. 2a shows a schematic circuit diagram in accordance with a first embodiment of the invention, the diagram showing a feedback active load pull circuit 1 connected to a DUT 6 (Device Under Test). The DUT may for example be a high power transistor, such as a "LDMOS" (laterally diffused metal-oxide silicon) device. The circuit 1 consists of an amplifier, a signal circulator 7, and means for manipulating signals inside a frequency band and outside a frequency, the means being represented schematically by a band filter 8, and a signal modifier 9.

The signal modifier 9 allows the phase and magnitude of signals to be altered and allows the active load pull applied by the circuit 1 to the DUT 6 to be controlled. In use signals $b_{OUT}$ enter the feedback circuit 1 from the DUT 6, are then fed from the signal circulator 7 to the filter 8, then to the signal modifier 9, and then to the amplifier 5, the amplified signals then passing back via the signal circulator 7 to the DUT 6 as signals $a_{OUT}$. The signal $a_{OUT}$ produced by the load pull circuit 1 is dependent on the signal $b_{OUT}$ produced by the DUT 6, and therefore changes in the signal $b_{OUT}$ cause corresponding changes in the signal $a_{OUT}$ (provided that the characteristics of the components of the load pull circuit do not change significantly; for example the saturation of the amplifier remains substantially constant). Thus, in use, the reflection coefficient $\Gamma_L$ (the ratio $a_{OUT}/b_{OUT}$) is effectively locked once it has been set, and does not vary significantly with changes in the loading or biasing of the DUT 6.

The filtering and manipulation of the signals performed by the feedback circuit 1 (represented schematically by filter 8 and modifier 9) ensures a stable operation of the feedback load pull system. The measurements made with the load pull system are all concerned with signals within known frequency ranges, for example, frequencies at or around the fundamental or a given harmonic frequency. Frequencies outside these ranges, and which are therefore of no interest, may be filtered out (the filtering being represented by band filter 8, but it will of course be appreciated that other means could perform such a filtering step). Without filtering, signals at other frequencies might cause system instabilities. For example, because the isolation between the signal $b_{OUT}$ entering the load pull circuit 1 and the signal $a_{OUT}$ leaving the circuit is provided only by the reflection coefficient of the DUT 6, there is a possibility of oscillations occurring at a frequency within the bandwidth of the load pull components as soon as the gain of the loop is larger than one (i.e. leading to the formation of a positive feedback loop at one or more frequencies). Whilst, such positive feedback loops can be avoided at the harmonic frequency by setting the characteristics of the variable components of the active load pull circuit, feedback loops could still occur at other frequencies because of the great variance in gain of the circuit with a modest change in frequency. Signals within the frequency ranges of interest are not filtered out by the filter 8, but are prevented from causing positive feedback by means of signal-modifying unit 9 performing in-band signal manipulation (for example, by attenuating the signal at given frequencies within the range).

Figure 5:
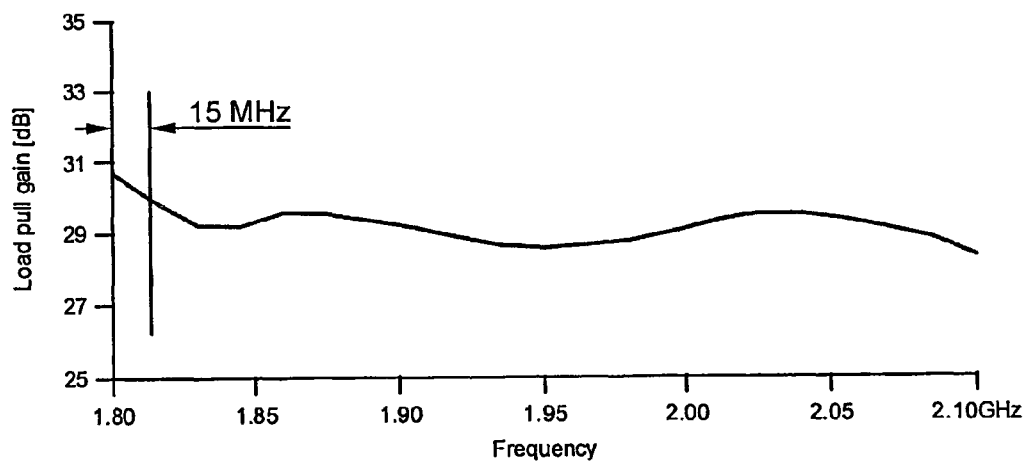
FIG. 5 is a graph of the gain of the circuit of FIG. 1, without a narrow band filter, against frequency.

A graph illustrating (in respect of a circuit excluding the band filter 8 and modifier 9, but otherwise being identical to that of FIG. 2a) how gain varies with frequency can be seen in FIG. 5. At a frequency of 1.8 GHz a variation in frequency of only 15 MHz can cause about 0.8 dB (almost 20%) change in gain. Thus if the load pull circuit operates in a condition close to positive feedback at the frequency of interest, there would, without the band filter 8 and signal-modifying unit 9, exist positive feedback loops at other frequencies, which coupled together with inherent "noise" in the system would quickly render the system unstable. At a frequency of 1.8 GHz a variation in frequency of 200 KHz (i.e. a 0.01% bandwidth) still produces a 0.05 dB (about 1%) change in gain. Whilst the effective gain of the amplifier 5 need not be constant across the bandwidth of the feedback circuit 1, if the filter 8 were to be used alone to avoid a positive feedback situation, the bandwidth would have to be so narrow that measurements of the response of the DUT 6 would have to be very significantly limited.

The frequency on which the bandwidth of the filter 8 is centred is able to be pre-selected thus enabling the load pull circuit 1 to be used at a variety of different frequencies. The ability to so tune the filter 8 also allows the amplifier to have a bandwidth significantly wider than the bandwidth of the filter.

Figure 2B:
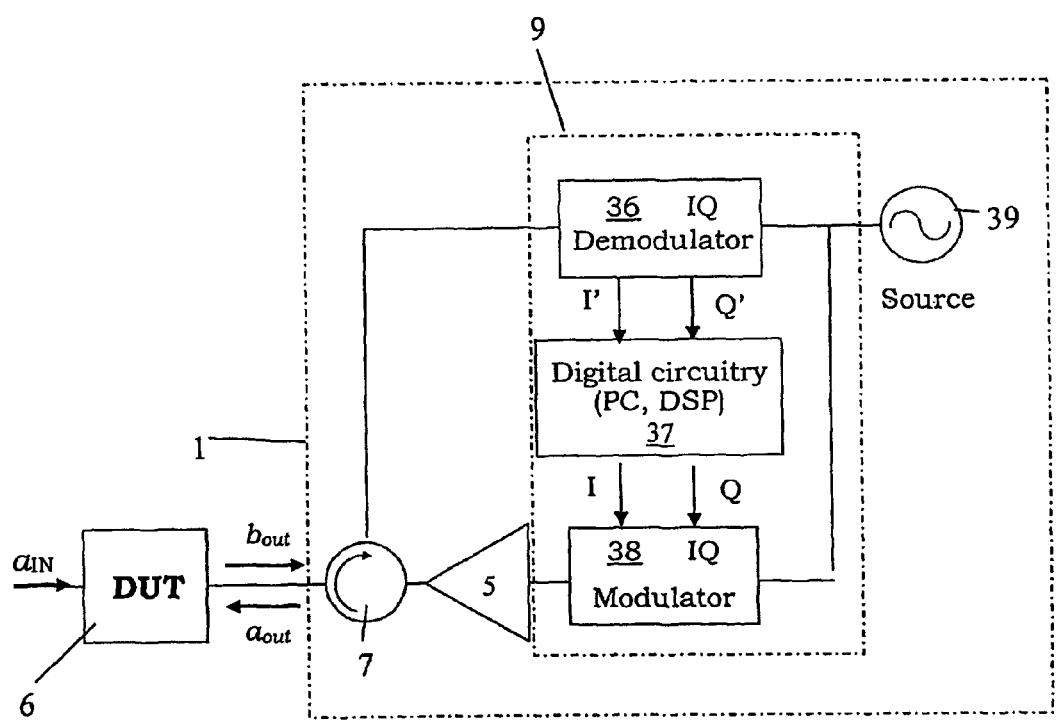
FIG. 2b shows a schematic circuit diagram of an active load pull circuit according to a second embodiment.

FIG. 2b shows a schematic circuit diagram in accordance with a second embodiment of the invention, the circuit being in accordance with the schematic diagram of the first embodiment (FIG. 2a). The circuit includes a feedback active load pull circuit 1 connected to a DUT 6. The circuit 1 consists of an amplifier 5, a signal circulator 7, and signal-modifying means 9 for manipulating signals inside a frequency band and outside a frequency band. The signal-modifying means 9 includes an IQ demodulator 36, which receives signals from the signal circulator 7. The signals from the IQ demodulator 36 are received by a digital signal-processing unit 37 (which may be in the form of a PC, or specially configured digital signal processor). The processed signals from the digital signal-processing unit 37 are received by an IQ modulator 38. In use, the signal $b_{out}$, generated by the DUT 6, is fed via the signal circulator 7, to the IQ demodulator 36. The IQ demodulator generates the signal I' and Q', which represent the magnitude and phase of the signal $b_{out}$ in rectangular co-ordinates. The I'-value represents the x-value and the Q'-value represents the y-value of the signal $b_{out}$ on a rectangular xy-plot. The IQ demodulator downconverts, by means of a combination with a signal from a local oscillator source 39, the I' and Q' signals to a frequency, which is sufficiently low to be able to be processed by the digital signal processing unit 37, which digitises and then modifies the I' and Q' signals. The I' and Q' signals are modified to ensure that no positive feedback loop is caused at a frequency within a given range. The modified I and Q values are then fed to the IQ modulator 38, which generates a signal with a magnitude and phase represented by the I and Q signals. The signal generated by the IQ modulator 38 has the same frequency as the signal $b_{out}$ (the IQ modulator 38 upconverts the magnitude and phase information contained within the I and Q signals to the higher frequency, by means of a combination with a signal from a local oscillator source 39). The signal outputted by the IQ modulator 38 is then fed through the amplifier 5 into the DUT output. The digital signal-processing unit 37 effectively filters the signals. The change in the input and output IQ values of the input and output signals I' and I and Q' and Q generates a difference between the $b_{out}$ and $a_{out}$ waves, thereby facilitating the control of the reflection coefficient $\Gamma = a_{out}/b_{out}$.

Converting the magnitude and phase information contained within the signal $b_{out}$ to a lower frequency, and producing I' and Q' signals, has the advantage that this information can be digitised and then manipulated by the re-programmable digital circuitry 37. The digital circuitry 37 can vary the effective bandwidth of the filtering of the I' and Q' signals performed by the feedback circuit 1. The bandwidth may be varied in dependence on the frequency content of the signal $b_{out}$. Also the offset between I' and I as well as Q' and Q can be varied readily, thus controlling the frequency response of the load pull within the bandwidth of the filtering. As a result, the frequency response of the load-pull circuit may be controlled both outside and inside the bandwidth of the signal $a_{out}$ and $b_{out}$.

Figure 3:
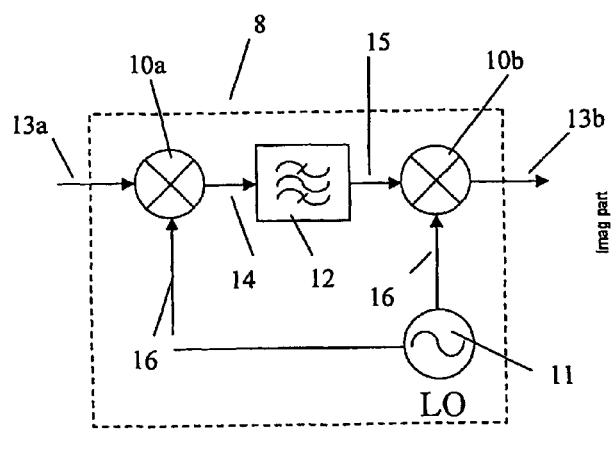

The band filter 8 shown schematically in FIG. 2a may alternatively be in the form of a heterodyne filter circuit, shown in more detail in FIG. 3. The signals entering the band filter 8 are represented by arrow 13a and the signals leaving the band filter 8 are represented by arrow 13b. The filter 8 comprises a tuneable local oscillator (LO) 11 that in use provides signals to two mixers 10a and 10b, interposed between which there is a conventional band-pass filter 12. The conventional band filter, which is in the form of a surface acoustic wave filter (SAW filter), has a range of between 169.9 MHz and 170.1 MHz (i.e. a bandwidth of 200 kHz). In use the local oscillator is set to produce two identical sine-wave signals (in phase with each other), represented by arrows 16, at a frequency close to the first harmonic frequency generated by DUT 6 such that the two frequencies are separated by 170 MHz. For example, if the fundamental frequency of the harmonic signal generated by the DUT is at 1.8 GHz the Local oscillator is set to oscillate at 1.63 GHz. The first mixer 10a sums the two signals and outputs a signal including a component having a frequency equal to the difference in frequencies of the two signals inputted at the mixer 10a, which in this case is 170 Mhz. Thus the incoming signal (arrow 13a) from the DUT 6 is effectively down-converted to a lower frequency signal, which is represented by arrow 14. The down-converted signals then pass through the conventional band-pass filter 12 and then (arrow 15) into the second mixer 10b, into which the other of the two signals (arrow 16) from the local oscillator 11 is also passed. The mixer 10b thus outputs a signal (arrow 13b) essentially consisting of a component having a frequency equal to the signal originally passed into the filter all signals having frequencies close to that frequency but more than 200 KHz apart having been filtered out. Thus the filter circuit 8 effectively acts as a very narrow band filter centred on a frequency of 1.8 GHz and having a bandwidth of 200 KHz. It will be appreciated that the pass filter 8 is tuneable by means of the Local Oscillator 11.

Of course it will be appreciated that if the load pull measurements are to be made over a frequency range having a 10% bandwidth, a filter circuit such as that shown in FIG. 3 may not be appropriate as such a circuit might filter out signals having frequencies outside the bandwidth of the filter circuit 8, but still being of interest. In such cases, the bandwidth of the filter circuit can be widened and the signal modulation capability of the signal-modifying unit 9 used to modify signals within the frequency band, thereby effectively actively flattening the frequency response of the load pull circuit over the bandwidth.

Figure 4:
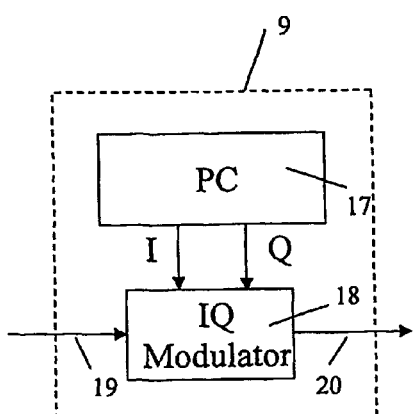

The signal modifier 9 shown schematically in FIG. 2a may be in the form of an IQ modulator simply controlled by a computer as shown in FIG. 4. In this embodiment, the signal modifier 9 comprises a programmed computer 17 and an IQ modulator 18. The IQ modulator 18 receives signals 19 from the band filter 8 (not shown in FIG. 4). The phase and magnitude of the signals entering the IQ modulator are changed in accordance with I and Q values set by the computer 17 the resulting output signal 20 being passed to the amplifier 5 (not shown in FIG. 4). The computer 17 can sweep through many I and Q values in sequence to provide results spanning an I-Q plane. Signals from the computer 17 are converted into DC signals by a digital to analogue converter (not shown) before entering the DC controllable I and Q inputs of the IQ modulator 18. Again, the computer 17 is able to perform in-band modification of the signals and the filter circuit 8 (not shown in FIG. 4) performs out-band filtering of the signals.

Figure 8:
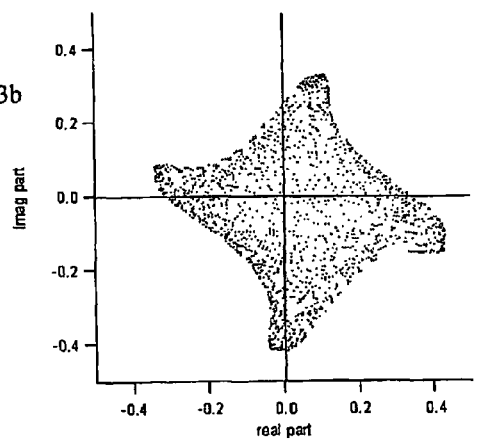
FIG. 8 shows points in an IQ plane at which measurements are made during calibration.
Figure 9A:
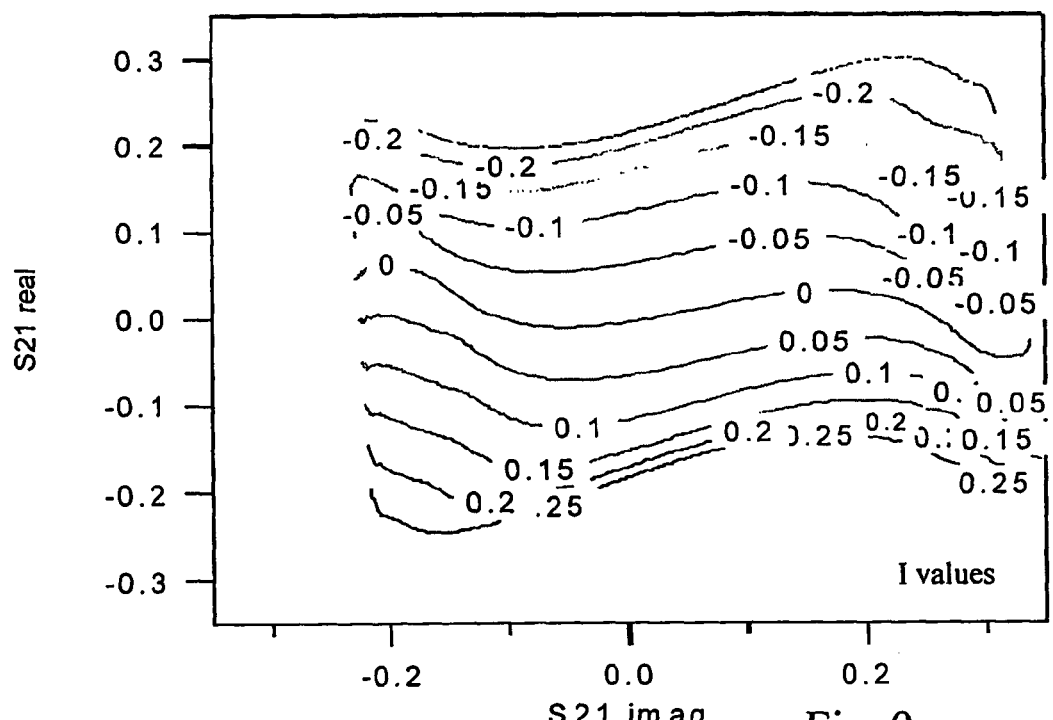
FIGS. 9a and 9b show results of s-parameter measurements made at the points shown in FIG. 8.
Figure 9B:
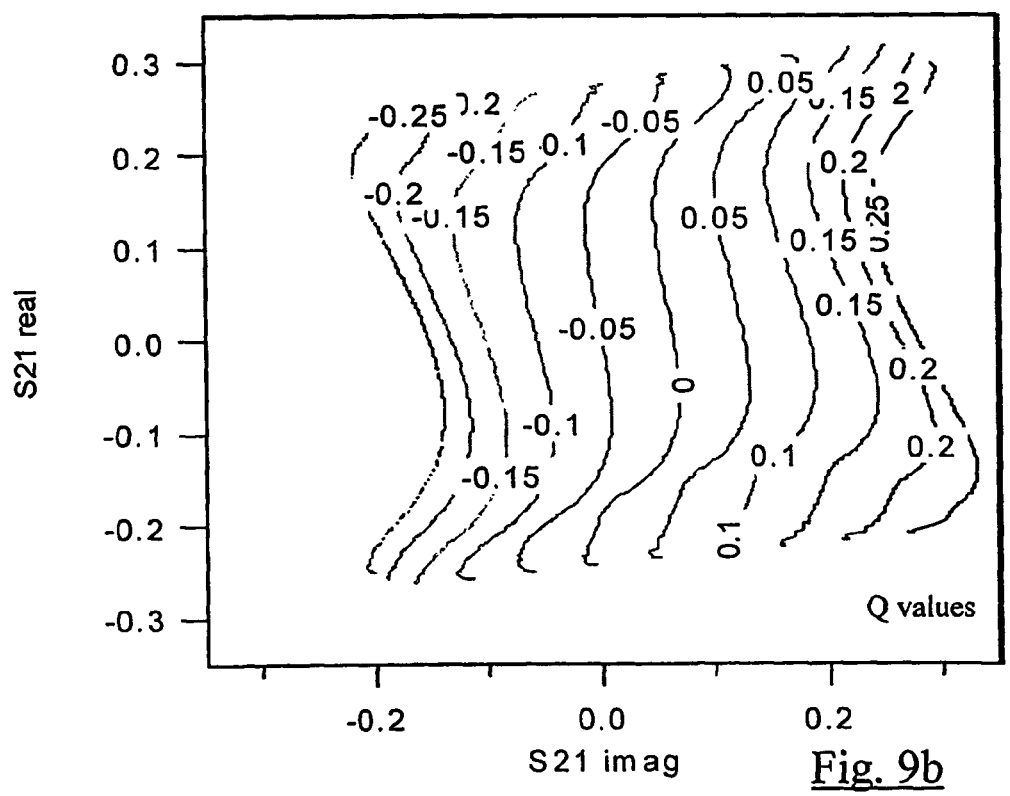

Before, analyzing the characteristics of a DUT, it is first necessary to calibrate the active load pull circuit 1. During calibration, the computer 17 causes the IQ modulator 18 to step through I and Q values and, at each point in the IQ plane, the load generated by the load pull circuit 1 is measured at measurement reference plane A (see FIG. 2a) with a VNA (vector network analyzer), such as for example a Hewlett-Packard HP_8753 VNA. The VNA also produces an input signal, which is fed into the active load pull circuit 1. (The VNA effectively replaces the DUT 6 as shown in FIG. 2a.) Measurements are made in respect of IQ points across a matrix of 121×121 points as shown in FIG. 8. According to this present embodiment, the points at which measurements are made reach only a magnitude of up to 0.4 of the input signal. However, it will be appreciated that the magnitude of the signal outputted by the amplifier 5 may have a magnitude in excess of 0.4 depending on the gain of the amplifier 5. The calibration process takes about 10 minutes to perform. From the loads measured at the points in the I-Q plane, two contour plots are generated in the (s-parameter) $s_{21}$ load plane, one plot having contours representing constant I values (the Q-values changing as along the length of each contour), the other plot having contours representing constant Q values (the I-values changing as along the length of each contour). It is thus possible to generate any desired load/impedance, within the boundaries of the contour plots produced, by setting I and Q values appropriately. Any loads/impedances, which were not generated by the load pull during the calibration process, may be reproduced by interpolating between the points available on the contour plots. Example, contour plots produced by such a calibration step are shown in FIGS. 9a and 9b.

During subsequent analysis of a DUT, measurements are made at reference plane B, by means of a Microwave Transition Analyzer (MTA) connected to a directional coupler interposed between the active load pull circuit 1 and the DUT 6. The introduction of a coupler alters the previously calibrated network, where measurements were made in respect of reference plane A. Thus, as a further step in the calibration procedure, a 3 point calibration is conducted to enable the loads at reference plane B (the output port of the DUT 6) to be mapped to corresponding values at reference plane A to enable the loads set by the active load pull circuit 1 to relate to loads at reference plane B. The load pull circuit 1 is attached via a directional coupler (not shown) to a pre-calibrated measurement system in the form of a microwave transition analyzer (MTA) (not shown) which is able to measure signals derived from $a_{out}$ and $b_{out}$. Then 3 "known" loads are applied by the load pull circuit, for example, by setting the I and Q values to [0.2, 0], [0, 0] and [−0.2, 0]. From the difference between the loads measured by the measurement system, at reference plane B, and the known loads previously measured at plane A by the VNA during the previous calibration procedure, the s-parameters of the network between planes A and B can be extracted. Thus, the loads set by the load pull circuit can be set at values relating to the loads at plane B (at the DUT output port) as opposed to plane A.

The calibration and control of the active load pull circuit is automated by means of a suitably programmed computer. The software used in the present embodiment provides the ability to set voltage ranges (in the IQ plane) and the amount of points at which the calibration process is performed. After the calibration step has been performed the programmed computer is able to apply a load equivalent to any reflection coefficient within the Smith chart, once provided with details of a desired magnitude and phase by the user. The programmed computer can also be instructed to perform a reference plane calibration, if a shift of the reference plane is necessary (enabling the user to specify desired reflection coefficients in respect of the new reference plane B).

In use the fully calibrated analyzer including the active load pull circuit 1, MTA and directional coupler is connected to a DUT 6, the coupler being interposed between the DUT and the load pull circuit. A signal generator then produces an input signal a at a pre-selected frequency which is applied to the input port of DUT 6. The load pull circuit 1 then applies different pre-selected load pulls and measurements of the response of the DUT 6 are made with the MTA. The whole process is governed by a single suitably programmed computer.

The programmed computer also facilitates the automation of more complex load pull measurements. For example, measurements may be made at a multiplicity of different input signals $a_{IN}$ (received by the DUT 6). The computer sets an input signal and then causes the load applied by the active load pull to be set at a pre-selected value. The computer then receives input data relating to the measurement made at the particular input signal and the active load pull applied. Thereafter the load applied by the active load pull is changed from one value to the next in a sequence that spans the region of interest in the IQ plane and at each load a further measurement is made. For example, measurements may be made over a range of magnitudes from 0 to 1 at a resolution of 0.2 and at a phase resolution of 5 degrees (a total of 360 points in the IQ plane arranged as five concentric load circles). After measurements have been made in respect of a sufficient number of points in the IQ plane, the input signal is then changed and the process repeated. Since the feedback load pull tracks the output signal generated by the DUT no corrections are necessary in order to keep the load constant for varying power levels. Measurements may for example be made in respect of a multiplicity (20, for example) of different power levels of input signals spanning a range of 0 to 30 dBm in steps of 0.1 dBm (i.e. 1 mW to 1 W). Changing from one set of parameters to another and performing the load measurements can be completed with the aid of the computer within a relatively short period of time (in a fraction of a second). Thus a sufficient number (for example 7,200) of load pull measurements to characterise a DUT can, with the present embodiment, be conducted within a period of time of the order of minutes.

Such results can then be utilised to improve the design of power amplifiers, for example, power amplifiers for use in telecommunication base stations.

Measurements carried out to determine the accuracy of the load pull system have given a maximum magnitude error of 0.006 and a maximum phase error of 0.5°.

Thus the first embodiment provides an active load pull measurement system for characterising an electronic device (to enable the improvement of the device and circuits in which the device is to be used), wherein a lower quality amplifier may be used without prejudicing the overall performance of the system. Costs may thereby be reduced.

Figure 6:
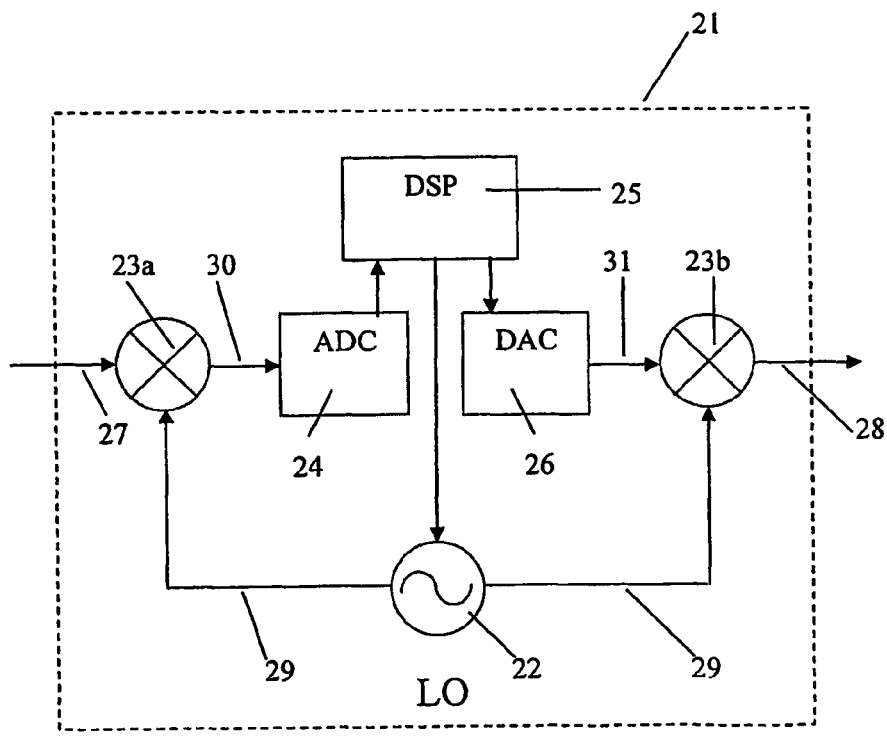
FIG. 6 shows a combined narrow band filter and modulator for use in a third embodiment of the invention.

According to a third embodiment of the invention, the function of the band filter 8 and signal modifier 9 (shown in FIG. 2a illustrating the first embodiment) are provided by means of a digital signal processing circuit 21, shown in FIG. 6. The circuit 21 comprises a tuneable local oscillator (LO) 22 that in use provides signals to two mixers 23a and 23b, interposed between which there are an eight-bit analogue-to-digital converter (ADC) 24, a digital signal processor 25, and an eight-bit digital to analogue converter 26. (The bit-resolution of the ADC and the DAC can of course be increased if greater accuracy is required.) The signals entering the circuit represented by arrow 27 and the signals leaving the circuit 21 are represented by arrow 28. In use the local oscillator is set (by under the control of the DSP 25) to produce two identical sine-wave signals (in phase with each other), represented by arrows 29, at a frequency very close to the first harmonic frequency generated by DUT 6 in a manner similar to that of the narrow band filter 8 described with reference to FIG. 3. The first mixer 23a sums the two signals and outputs a signal including a component having a frequency equal to the difference in frequencies of the two signals inputted at the mixer 23a, which in this case is 1 Mhz. Thus the incoming signal (arrow 27) from the DUT 6 is effectively down-converted to a lower frequency signal, which is represented by arrow 30. The down-converted signals then passes to the ADC, whereupon the signal is converted to a digital signal. The sampling rate is set to be at least four times the frequency of the incoming signal. In the present embodiment the sampling rate of the ADC is 40 MHz, whilst the frequency of the signal being sampled is 1 MHz. The DSP then processes the signal and outputs a digital signal that is then converted into an analogue signal by the DAC 26. The resulting output signal 31 is then passed to the second mixer 23b and is recombined with the other of the two signals (arrow 29) from the local oscillator 22 at the second mixer 23b. The output signal 31 from the DAC 26 contains substantially no signal components at frequencies other than the frequency of interest.

It will be appreciated that the DSP can be arranged to process the signals received to improve the performance of the load pull circuit 1. The DSP both performs a filtering function and an in-band signal manipulation function. The DSP is thereby able to reduce the chance of positive feedback loops existing in the load pull circuit. Also, components of the circuit 1 may have non-ideal behaviour and the DSP could be programmed to compensate for such non-idealities. For example, the mixers may have behaviour that whilst non-linear is readily characterised. Once characterised (during a suitable calibration procedure) compensations may be made by the DSP in respect of that non-linear behaviour.

Figure 7:
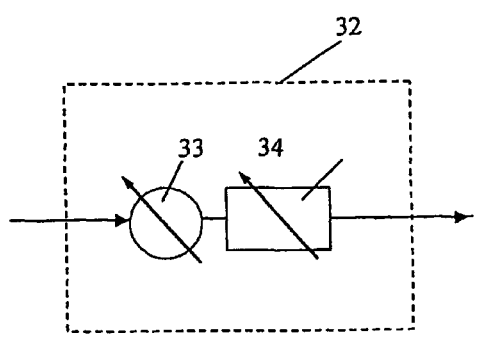
FIG. 7 shows a modulator for use in a fourth embodiment of the invention.

According to a fourth embodiment of the invention shown in FIG. 7, the signal modifier 9 of the first embodiment is replaced with a simple signal modulator circuit 32 comprising a variable phase shifter 33 and a variable amplifier 34, both of which are controlled by a suitably arranged computer.

According to a fifth embodiment, which utilises the apparatus and circuits provided in accordance with the third embodiment, the LO is caused to oscillate at the same frequency as the frequency of interest. The output of the first mixer 23a therefore comprises a DC component representative of the magnitude of the component of the input signal (arrow 27) at the frequency of interest. Control of the relative magnitude and phase of the load applied by the active load pull is controllable by modifying the phase of the LO relative the phase of the signal inputted into the DUT 6 and generated by the single generator (not shown) and by modifying the magnitude of the DC signal sent to the second mixer 23b. It will be appreciated that the same technique could be used in relation to the first and fourth embodiments.

Figure 10:
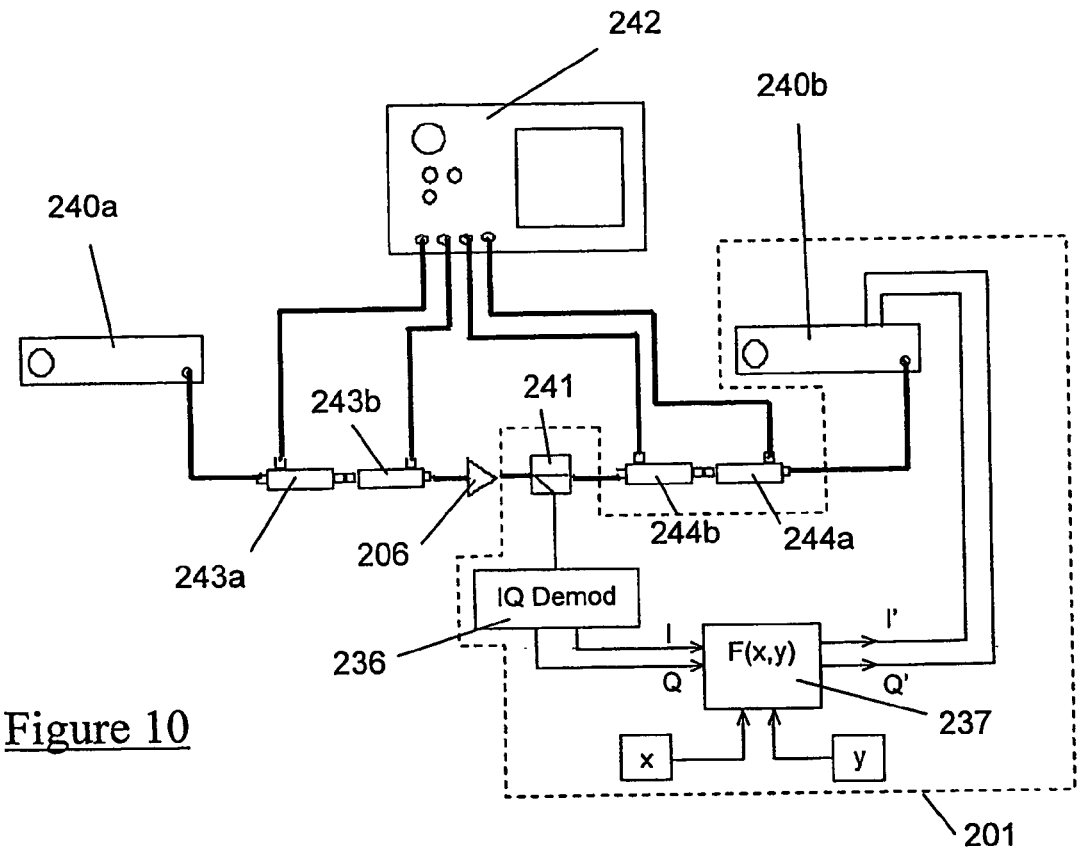
FIG. 10 shows a further embodiment of the invention featuring a signal processing unit.
Figure 11:
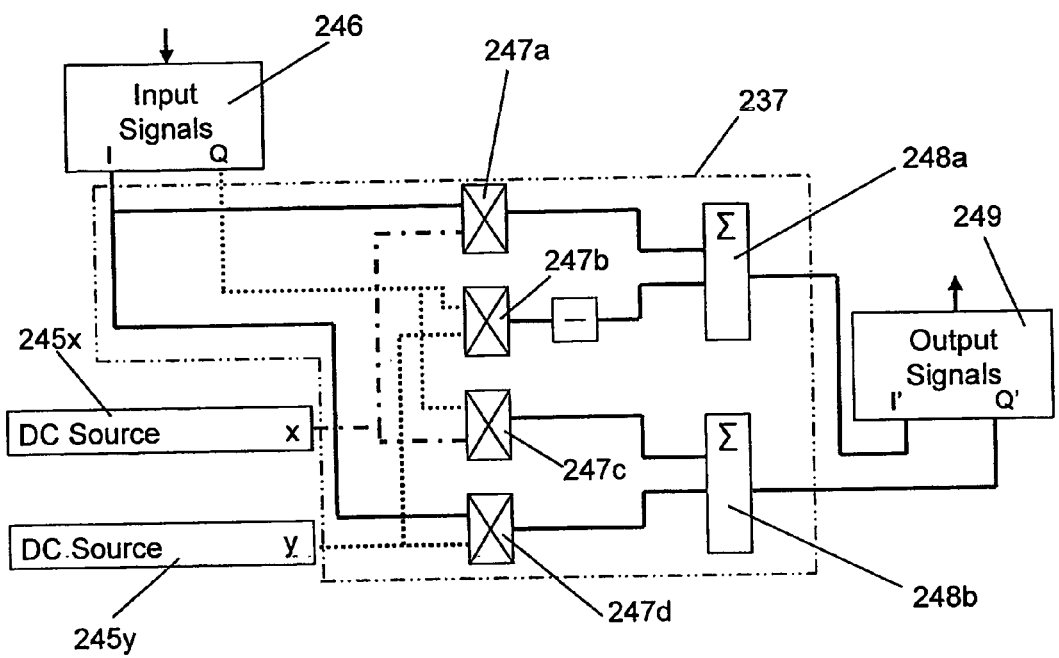
FIG. 11 shows the signal processing unit of FIG. 10 in further detail.

A sixth embodiment is illustrated in FIGS. 10 and 11. The circuit shown schematically in FIG. 10 is similar in concept to that of the second embodiment and comprises a DUT 206 connected at a first port to a first signal source 240a (in this case, in the form of an Agilent ESG RF signal generator available from Agilent Technologies Inc, a US corporation). A second port of the DUT 206 is connected to an active load pull circuit 201. The load pull circuit extracts a small fraction of the signal travelling from the second port of the DUT 206 by means of a first signal coupler 241, the extracted signal being fed to an IQ demodulator 236, which effectively down-converts the input signal into I and Q signals. The signals from the IQ demodulator 236 are received by an analogue signal-processing circuit 237, which is described below in further detail. The analogue signal-processing circuit 237 transforms the I and Q signals received from the IQ demodulator into new signals I' and Q', by means of a preset transformation defined in part by input signals x and y. The transformed signals are received by a second signal generator 240b (also an Agilent ESG RF signal generator), which effectively upconverts the I' and Q' signals into a modified feedback signal (with a magnitude and phase represented by the I' and Q' signals), which is fed back to the second port of the DUT via the first coupler. Effectively, the signal generator 240b is used here as an IQ modulator, by means of the in-built IQ modulator of the signal generator 240b. Thus, the circuit 201 acts as an active load pull feedback circuit with the feedback loop being controllable by means of controlling the inputs x and y supplied to the signal-processing circuit 237. The circuit of the sixth embodiment may be considered as effecting a transfer function which controls the relationship between the signal generated by the DUT 206 and the signal generated by the active load pull circuit 201, the transfer function being able to be controlled by the programmable DC sources providing the signals x and y. Measurements are made by means of a oscilloscope 242, which is supplied with signals representative of the transmitted and reflected signals at the first port of the DUT by means of second and third couplers 243a and 243b (provided in series and between the first signal generator 240a and the DUT 206) and signals representative of the transmitted and reflected signals at the second port of the DUT by means of fourth and fifth couplers 244a and 244b (provided in series and between the first coupler 241 signal generator 240a and the DUT 206).

FIG. 11 shows the signal-processing circuit 237 of the sixth embodiment in further detail. DC signals, x and y, generated by two separate controllable signal generators 245x and 245y and input signals I and Q, represented by box 246, from the IQ demodulator 236 (not shown in FIG. 11) are fed into four signal multipliers 247a, 247b, 247c and 247d to produce signals representative of xI, yQ, xQ and yI, respectively. The signal representative of yQ is fed via an inverter to a first signal summation device 248a, which also receives the signal representative of xI. Thus, the output of the summation device is representative of xI–yQ. The signals representative of xQ and yI are to a second signal summation device 248b, which outputs a signal representative of xQ+yI. The output of the first and second summation devices are fed as transformed signals I' and Q' (represented by box 249) to the signal generator (not shown in FIG. 11), which effectively upconverts and modulates the I' and Q' signals.

Thus the transformation function, F(x,y) effected by the analogue signal-processing circuit 237 can be expressed as $I'=IX-QY$; and $Q'=IY+QX$, such that:

$$F_{x,y}(I, Q) = I' + jQ'$$
$$= (x \cdot I - y \cdot Q) + j(x \cdot Q + y \cdot I)$$
$$= (x + jy) * (I + jQ), \text{ and}$$

$(I'+jQ')/(I+jQ)=x+jy=Z$, where Z is a constant complex number.

Choosing Z as a constant results in the relationship between the signal generated by the device under test (DUT 206) and the signal generated by the load pull circuit 237 also remaining constant. This means that any change in the signal is reproduced by the load pull circuit, thus simulating a constant impedance. This is of particular use for modulated signals, which exhibit varying signal levels over the modulation bandwidth (in much the same way as occurs within telecommunication systems such as GSM or UMTS).

Figure 12A:
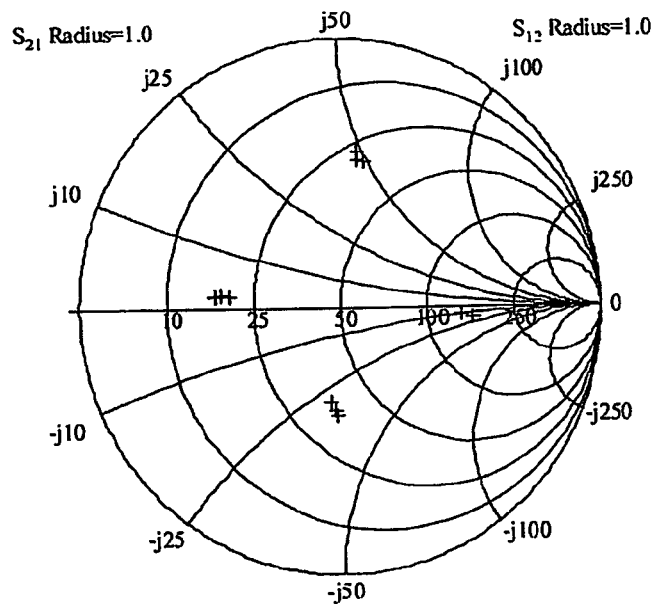
FIGS. 12a and 12b show Smith charts showing results of the measurement of s-parameters using the embodiment shown in FIGS. 10 and 11.
Figure 12B:
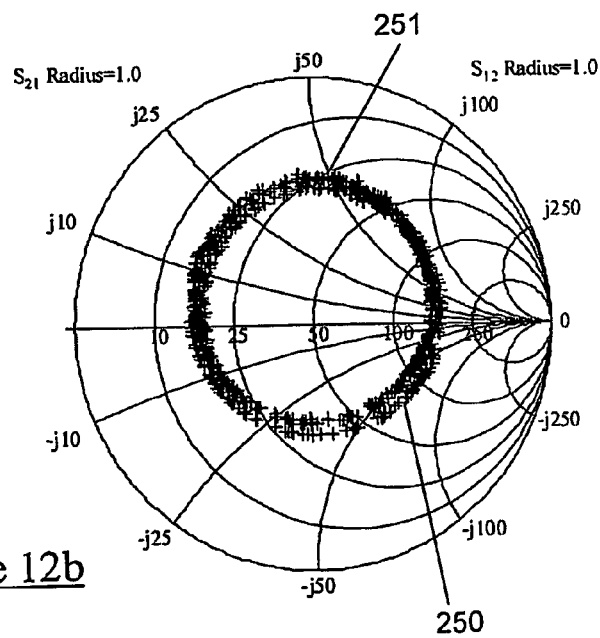

FIGS. 12a and 12b show some of the results obtained with the measurement configuration shown in FIGS. 10 and 11. For these measurements a signal with three tones was used with a centre frequency at 1.8 GHz and a tone separation of 20 kHz. (It will be appreciated that larger tone separations can be used.) The first plot shown in FIG. 12a was produced by setting the magnitude of the load signal to be half that of the input signal, then sweeping its phase in 90° steps. Since the load presented is broad band, i.e. it is constant, the three points lie on top of each other for each phase setting. In the second plot shown in FIG. 12b the impedance is swept in a circle around the smith chart with a measurement taken every degree, which is achieved by sweeping values of X and Y. In the plot illustrated by FIG. 12b, two circles of points may be discerned, the first lower circle 250 representing the carrier and the second upper circle 251 representing the plot points for the upper and lower sidebands, which are so close to one another in FIG. 12b as to be indistinguishable from one another.

In summary, the analyzer measures the response of the DUT 206 to an RF input signal (which may be multi-tone) from the signal generator 240a. The active load pull circuit 201, connected to the DUT 206, receives an output signal from the DUT 206 and then feeds a modified signal back to the DUT 206. The signal is modified by the signal processing circuit 237, in view of input signals x, y, to control the magnitude gain and phase change effected by the feedback circuit 237. The signal measuring device (oscilloscope 242) measures the waveforms (from which s-parameters can be derived) observed at ports of the DUT 206, thereby allowing the behaviour of the DUT 206 under various load conditions to be analyzed. Positive feedback loops are able to be avoided and better analysis of the behaviour of the DUT is made possible by means of the better control afforded by the load pull circuit 237. It will be readily apparent to the skilled person that various modifications may be made to the above-described embodiment without departing from the spirit of the invention. For example, if desired, the DSP 25 described above with reference to the second embodiment may also be arranged, under the control of a suitably programmed computer (not shown in FIG. 3), to process the incoming signal 30 to modify its magnitude and phase, thereby removing the requirement for a separate modulator.

The bandwidth of the very narrow band filter circuit formed by means of the circuit shown in FIG. 3 may be narrower than 200 KHz, which at an input signal of 2 GHz represents a bandwidth of 0.01%. It is envisaged that it would be possible to reduce the bandwidth to as low a figure as is required. The minimum bandwidth that it is proposed would be implemented in accordance with the above-described embodiments is the lower of 200 kHz or 0.01% of the frequency on which the narrow band is centred.

It will be understood that, in relation to the embodiment illustrated by FIG. 3, the filtering characteristics of the band filter circuit 8 are determined by the choice of conventional filter 12 and the relative frequency difference between the input signal and the frequency of the signal produced by the LO 11. Once a conventional band pass filter 12 has been chosen (having the desired bandwidth), the frequency on which the band filter 8 is centred can be set by pre-selecting, an appropriate frequency signal to be produced by the LO 11. For example, if the conventional filter has a 100 KHz bandwidth centred at 1 MHz and the desire is to centre the bandwidth of the very narrow band filter at 1.8 GHz, the LO 11 would be set to oscillate at 1.799 GHz or 1.801 GHz.

Also, features of one embodiment may, where appropriate, be readily incorporated in another embodiment. For example, the filter 8 and the signal modifier 9 of the schematic circuit of first embodiment may be formed by the DSP circuit 21 of the third embodiment and the modulator 32 of the fourth embodiment, respectively.

Other improvements to the above-described embodiments may be made. For example, with reference to the circuit shown in FIG. 3, depending on the quality of the mixers used, there may be some unwanted signal leakage back into the DUT from the active load pull circuit. Such leakage may for example originate from the Local Oscillator. If so, and if the Local Oscillator is set to oscillate at a frequency different from that of the frequency of interest such signal leakages can be mitigated by means of a further filtering circuit, for example a high pass filter or low pass filter with a cut-off frequency between the LO signal frequency and the output frequency of the load pull circuit. LO leakage may alternatively be compensated for, in the second embodiment, by means of the DSP.

Since the signal generated by the output port of the DUT is a wave, often consisting of a number of frequencies, the output port effectively sees a separate, generally different, reflection coefficient at each frequency. The load pull systems shown in the Figures manipulate a reflection coefficient at a single frequency or a single continuous frequency band. The value of the impedance, i.e. load, at each frequency and/or bandwidth may be controlled by attaching for each frequency/bandwidth a separate load pull circuit to the device. Such a multi-tone analyzer may be provided, for example, consisting of a plurality of active load pull circuits having band filters centred on different frequencies (for example, at different harmonic frequencies). Each active load pull circuit could for example be in the form of the circuit 1 of FIG. 2b, the circuit being connected to the DUT via a signal junction or a signal splitter. Alternatively, one such load pull circuit (as shown in FIG. 2b) could include a signal splitter arranged to receive signals from the signal circulator 7, the split signals being fed via respective separate portions of the circuit, each portion including a filter, a modulator and an amplifier.

One modification of the sixth embodiment that has been envisaged relates to the case where a control of the signals over a wider bandwidth is desired. In that case, rather than using DC sources to generate the x and y values, arbitrary waveform generators (AWGs) could be used, thereby permitting the control of the x and y values over a wider bandwidth.

In the embodiments described above, the load pull circuit has been shown as being connected to the output only of the DUT. There could therefore be provided an analyzer, for example, consisting of at least two active load pull circuits, one load pull circuit being provided at the input to the DUT and the other being provided at the output.

The invention claimed is:

1. An analyzer for measuring the response of an electronic device to a high frequency input signal, the analyzer including:
    an active load pull circuit connectable in use to a device to be analyzed, the active load pull circuit including
    a feedback circuit arranged (i) to receive an output signal from the device to be analyzed, (ii) to modify the signal, the modification including limiting the magnitude gain of the feedback circuit at frequencies outside a band of frequencies to essentially no magnitude gain, (iii) to feed the modified signal back to the device to be analyzed, the modified signal fed back comprising a component having a frequency within said band, and (iv) to control the magnitude gain of the feedback circuit at frequencies inside the band of frequencies to other than essentially no magnitude gain.

2. An analyzer according to claim 1, wherein the analyzer is so arranged that the magnitude gain of the feedback circuit at one or more frequencies within the frequency range is able to be adjusted.

3. An analyzer according to claim 1, wherein the analyzer is so arranged that the phase change effected by the feedback circuit at one or more frequencies within the frequency range is able to be adjusted.

4. An analyzer according to claim 1, wherein the feedback circuit is arranged to restrict the phase change effected by the feedback circuit at all frequencies within the frequency range.

5. An analyzer according to claim 1, wherein the feedback circuit is so arranged that it acts as a band filter having a bandwidth covering frequencies within the range.

6. An analyzer according to claim 5, wherein the feedback circuit is so arranged that it acts as a band filter having a bandwidth of greater than 10 MHz.

7. An analyzer according to claim 1, wherein the analyzer includes a high frequency band filter circuit arranged to filter signals in or from the feedback circuit before they are fed back to the device, the band filter circuit having a bandwidth covering frequencies within the range.

8. An analyzer according to claim 1, wherein the feedback circuit includes a heterodyne filter ring circuit.

9. An analyzer according to claim 8, wherein the heterodyne filter ring circuit includes a first mixer, a second mixer, and a signal-modifying unit, the heterodyne filter ring circuit being so arranged that in use it receives an input at the first mixer together with a signal having a preselected frequency, and the output from the first mixer is sent via the signal-modifying unit to the second mixer, where it is combined with a signal having a frequency equal to the preselected frequency to produce the output signal of the heterodyne filter ring circuit.

10. An analyzer according to claim 1, wherein the feedback circuit includes a signal processor able in use to modify the signal from the device to be analyzed by a preselectable amount.

11. An analyzer according to claim 10, wherein the signal processor is arranged to process respective signals representative of the I and Q values of a signal.

12. An analyzer according to claim 1, wherein the analyzer includes a signal generator arranged to send an input signal to the device to be analyzed.

13. An analyzer according to claim 1, wherein the analyzer includes a signal measuring device for measuring loads arising in response to the signals applied to the device to be analyzed.

14. An active load pull circuit for use in an analyzer for measuring at frequencies within a frequency range the response of an electronic device to a high frequency input signal, the active load pull circuit being connectable in use to a device to be analyzed and including a feedback circuit arranged to receive an output signal from the device to be analyzed, to modify the signal, the modification including limiting the magnitude gain of the feedback circuit at frequencies outside the range of frequencies to essentially no magnitude gain, and to feed the modified signal back to the device to be analyzed, wherein the feedback circuit is arranged to control the magnitude gain of the feedback circuit at all frequencies inside the range of frequencies to other than essentially no magnitude gain.

15. An active load pull circuit according to claim 14, wherein the active load pull circuit is so arranged that at least one of (a) the magnitude gain of, and the (b) phase change effected by, the feedback circuit at one or more frequencies within the frequency range is able to be adjusted.

16. A method of measuring the response of an electronic device to a high frequency input signal, the method including the steps of:
    providing an electronic device to be analyzed,
    applying a high frequency signal to the device, and
    modifying an output signal from the device, the modification including limiting the magnitude gain of the feedback circuit at frequencies outside a band of frequencies to essentially no magnitude gain, and then feeding the modified signal back to the device, thereby forming a feedback loop, and
    measuring, at a plurality of frequencies within a frequency range, the response of the device to the signal applied to the device,
    wherein the magnitude gain of the feedback loop is controlled at frequencies inside the band of frequencies to other than essentially no magnitude gain.

17. A method according to claim 16, wherein the phase change effected by the feedback loop is restricted at frequencies within the frequency range.

18. A method according to claim 16, wherein the method includes a step of preselecting the way in which the output signal from the device is modified.

19. A method according to claim 18, wherein the method includes a step of preselecting a magnitude gain applied to the output signal from the device.

20. A method according to claim 18, wherein the method includes a step of preselecting a phase change applied to the output signal from the device.

21. A method according to claim 16, wherein the step of modifying the output signal from the device includes filtering out signals having frequencies outside a band of frequencies covering frequencies within the frequency range.

22. A method according to claim 16, wherein the fundamental frequency of the signal applied to the device is over 1 GHz.

23. A method according to claim 16, wherein the method is repeated and performed in respect of a multiplicity of different modifications of the output signal from the device.

24. A method according to claim 16, wherein the method is repeated and performed in respect of a multiplicity of different input signals applied to the device.

25. A method according to claim 16, wherein the method is performed with an analyser, the analyzer including:
    an active load pull circuit connectable in use to a device to be analysed the active load pull circuit including
    a feedback circuit arranged (i) to receive an output signal from the device to be analyzed, (ii) to modify the signal and (iii) to feed the modified signal back to the device to be analyzed, wherein
    the feedback circuit is arranged to limit the magnitude gain of the feedback circuit at all frequencies within the frequency range.

26. A method of calibrating an analyzer according to claim 1, wherein the calibration method comprising repeating the following steps for a multiplicity of different loads:
    applying a high frequency signal at the input of the feedback loop or feedback circuit, and
    modifying the applied high frequency signal and feeding the modified signal back to the input to synthesise a load,
    measuring, at a plurality of frequencies within a frequency range, the modified signal at the input,
    calculating the load represented by the feedback loop or feedback circuit in response to the particular modification made to the applied signal, and storing electronically the results of the measurements against the modifications to the signal.

27. A method of measuring the response of an electronic device to a high frequency input signal, the method including the steps of:
    providing an electronic device to be analyzed,
    applying a high frequency signal to the device, and
    modifying an output signal from the device, the modification including limiting the magnitude gain of the feedback circuit at frequencies outside a band of frequencies, and then feeding the modified signal back to the device, thereby forming a feedback loop, and measuring, at a plurality of frequencies within a frequency range, the response of the device to the signal applied to the device, wherein the magnitude gain of the feedback loop is controlled at frequencies inside the frequency range, wherein the method includes performing a calibration, the performance of the calibration comprising repeating the following steps for a multiplicity of different loads:

applying a high frequency signal at the input of the feedback loop, and modifying the applied high frequency signal and feeding the modified signal back to the input to synthesise a load, measuring, at a plurality of frequencies within a second frequency range, the modified signal at the input, calculating the load represented by the feedback loop in response to the modified signal, and storing electronically the results of the measurements against the modifications to the signal, so that predetermined loads may be applied at the output of the device by selecting an appropriate modification during the step of modifying the signal in accordance with the electronically stored measurements.

28. A method of improving the design of a high frequency high power device or a circuit including a high frequency high power device, the method including the steps of analyzing the behaviour of the device by using the analyzer of claim 1, and then modifying the design of the device or modifying the circuit including the device in consideration of the results of the analyzing of the behaviour of the device.

29. A method of manufacturing a high frequency high power device or a circuit including a high frequency high power device, the method including the steps of improving the design of a similar existing device or of an existing circuit including such a device by performing the method of claim 28 and then manufacturing the device or the circuit including the device in accordance with the improved design.

30. An analyzer for measuring at frequencies within a frequency range the response of an electronic device to a high frequency input signal, the analyzer including:
an active load pull circuit connectable in use to a device to be analyzed, the active load pull circuit including
a feedback circuit arranged
(i) to receive an output signal from the device to be analyzed,
(ii) to downconvert the signal received to a low frequency signal, to modify the low frequency signal, to upconvert the modified low frequency signal to a modified high frequency signal and
(iii) to feed the modified signal back to the device to be analyzed, wherein
the feedback circuit is arranged to limit the magnitude gain of the feedback circuit at all frequencies within the frequency range.

31. An analyzer for measuring at frequencies within a frequency range the response of an electronic device to a high frequency input signal, the analyzer including:
an active load pull circuit connectable in use to a device to be analyzed, the active load pull circuit including
a feedback circuit comprising a heterodyne filter ring circuit, the feedback circuit arranged (i) to receive an output signal from the device to be analyzed, (ii) to modify the signal and (iii) to feed the modified signal back to the device to be analyzed, wherein the feedback circuit is arranged to limit the magnitude gain of the feedback circuit at all frequencies within the frequency range; and wherein the heterodyne filter ring circuit includes a first mixer, a second mixer, and a signal-modifying unit, the heterodyne filter ring circuit being so arranged that in use it receives an input at the first mixer together with a signal having a preselected frequency, and the output from the first mixer is sent via the signal-modifying unit to the second mixer, where it is combined with a signal having a frequency equal to the preselected frequency to produce the output signal of the heterodyne filter ring circuit.

32. An analyzer for measuring at frequencies within a frequency range the response of an electronic device to a high frequency input signal, the analyzer including:
an active load pull circuit connectable in use to a device to be analyzed, the active load pull circuit including
a feedback circuit arranged (i) to receive an output signal from the device to be analyzed, (ii) to modify the signal, and (iii) to feed the modified signal back to the device to be analyzed, wherein the feedback circuit is arranged to limit the magnitude gain of the feedback circuit at all frequencies within the frequency range; and
wherein the feedback circuit includes a signal processor able in use to modify the signal from the device to be analyzed by a preselectable amount, the signal processor is arranged to process respective signals representative of the I and Q values of a signal.

33. A calibration method for an analyzer for measuring at frequencies within a frequency range the response of an electronic device to a high frequency input signal, the analyzer including an active load pull circuit connectable in use to a device to be analyzed, the active load pull circuit including a feedback circuit arranged (i) to receive an output signal from the device to be analyzed, (ii) to modify the signal and (iii) to feed the modified signal back to the device to be analyzed, wherein the feedback circuit is arranged to limit the magnitude gain of the feedback circuit at all frequencies within the frequency range, wherein the calibration method comprises repeating the following steps for a multiplicity of different loads:
applying a high frequency signal at the input of the feedback loop or feedback circuit, and
modifying the applied high frequency signal and feeding the modified signal back to the input to synthesize a load,
measuring, at a plurality of frequencies within a frequency range, the modified signal at the input,
calculating the load represented by the feedback loop or feedback circuit in response to the particular modification made to the applied signal, and storing electronically the results of the measurements against the modifications to the signal.

34. A method of measuring the response of an electronic device to a high frequency input signal, the method including the steps of:
providing an electronic device to be analyzed,
applying a high frequency signal to the device, and
modifying an output signal from the device and then feeding the modified signal back to the device, thereby forming a feedback loop, and
measuring, at a plurality of frequencies within a frequency range, the response of the device to the signal applied to the device,
wherein the magnitude gain of the feedback loop is limited at frequencies within the frequency range; and
wherein the method includes performing a calibration, the performance of the calibration comprising repeating the following steps for a multiplicity of different loads:

applying a high frequency signal at the input of the feedback loop or feedback circuit, and modifying the applied high frequency signal and feeding the modified signal back to the input to synthesise a load, measuring, at a plurality of frequencies within a frequency range, the modified signal at the input, calculating the load represented by the feedback loop or feedback circuit in response to the particular modification made to the applied signal, and storing electronically the results of the measurements against the modifications to the signal, so that predetermined loads may be applied at the output of the device by selecting an appropriate modification during the step of modifying the signal in accordance with the electronically stored measurements.

* * * * *